United States Patent
Chen

(10) Patent No.: US 10,872,959 B2
(45) Date of Patent: Dec. 22, 2020

(54) SEMICONDUCTOR DEVICE AND POWER CONVERTER

(71) Applicant: Mitsubishi Electric Corporation, Tokyo (JP)

(72) Inventor: Ze Chen, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 12 days.

(21) Appl. No.: 16/246,594

(22) Filed: Jan. 14, 2019

(65) Prior Publication Data

US 2019/0312113 A1   Oct. 10, 2019

(30) Foreign Application Priority Data

Apr. 5, 2018   (JP) .................. 2018-072915

(51) Int. Cl.
| | | |
|---|---|---|
| *H01L 29/40* | (2006.01) | |
| *H02M 7/5387* | (2007.01) | |
| *H01L 29/739* | (2006.01) | |
| *H02P 27/08* | (2006.01) | |

(52) U.S. Cl.
CPC ........ *H01L 29/407* (2013.01); *H01L 29/7397* (2013.01); *H02M 7/53871* (2013.01); *H02P 27/08* (2013.01)

(58) Field of Classification Search
CPC combination set(s) only.
See application file for complete search history.

(56) References Cited

U.S. PATENT DOCUMENTS

2003/0042537 A1    3/2003  Nakamura et al.

FOREIGN PATENT DOCUMENTS

| JP | 2008-021918 A | 1/2008 |
| JP | 2017-143195 A | 8/2017 |
| WO | 2002/058160 A1 | 7/2002 |

*Primary Examiner* — Ratisha Mehta
(74) *Attorney, Agent, or Firm* — Studebaker & Brackett PC

(57) ABSTRACT

A semiconductor device includes gate trenches and dummy gate trenches formed on the upper surface side of a semiconductor substrate, gate electrodes embedded in the gate trenches, dummy gate electrodes embedded in the dummy gate trenches, a channel layer formed in the surface portion on the upper surface side of the semiconductor substrate, a carrier storage layer formed below the channel layer, and a collector layer formed on the lower surface side of the semiconductor substrate. A relationship D4<D1<D3<D2 holds true, where D1 is the depth of the bottoms of the gate electrodes, D2 is the depth of the bottoms of the dummy gate electrodes, D3 is the depth of the bottom of the carrier storage layer, and D4 is the depth of the junction between the channel layer and the carrier storage layer.

8 Claims, 26 Drawing Sheets

F I G. 1
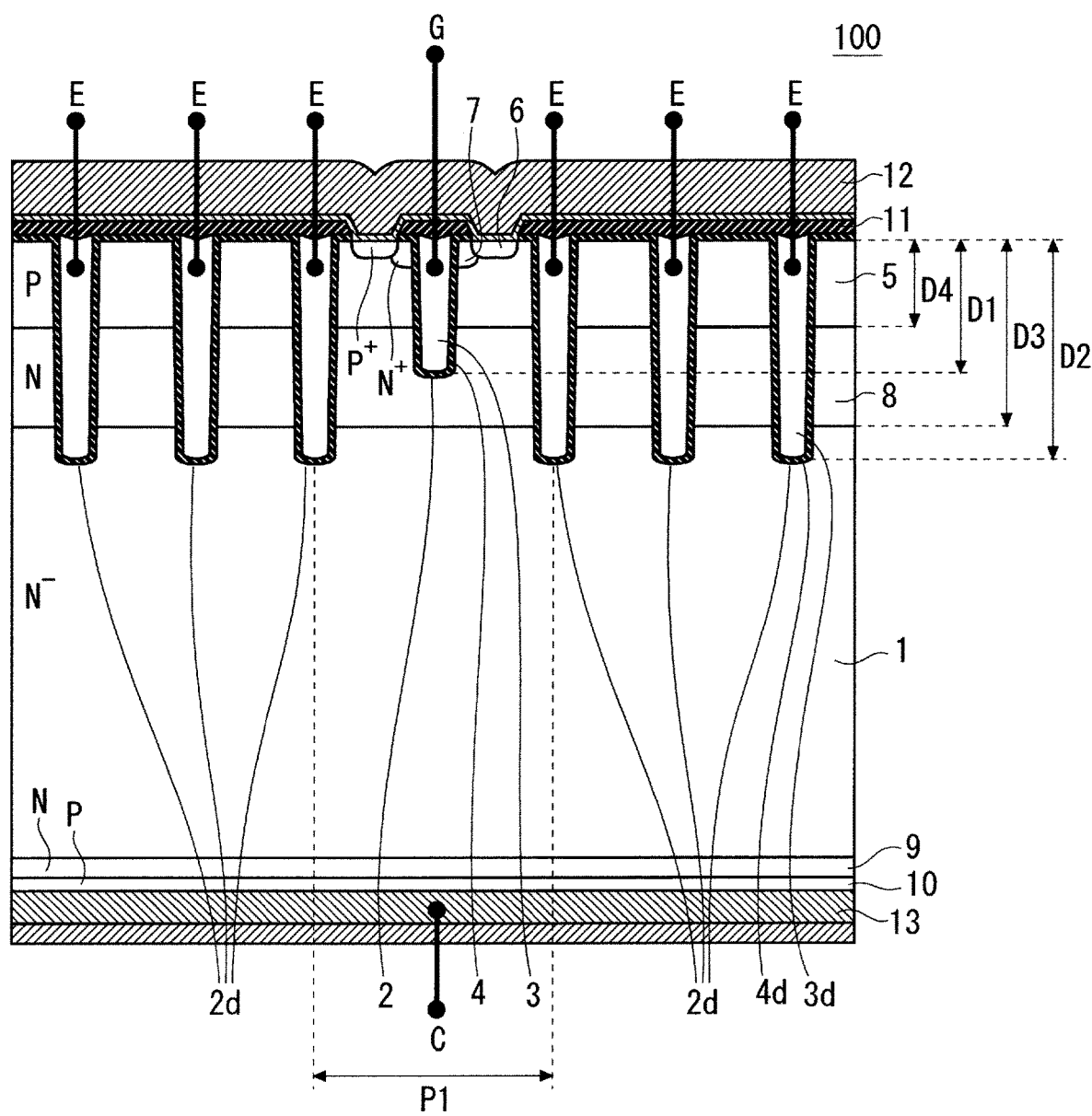

Vcc=1800V
Temperatur=423K
VG=±15V
Ls=2.47μH

F I G. 1 5
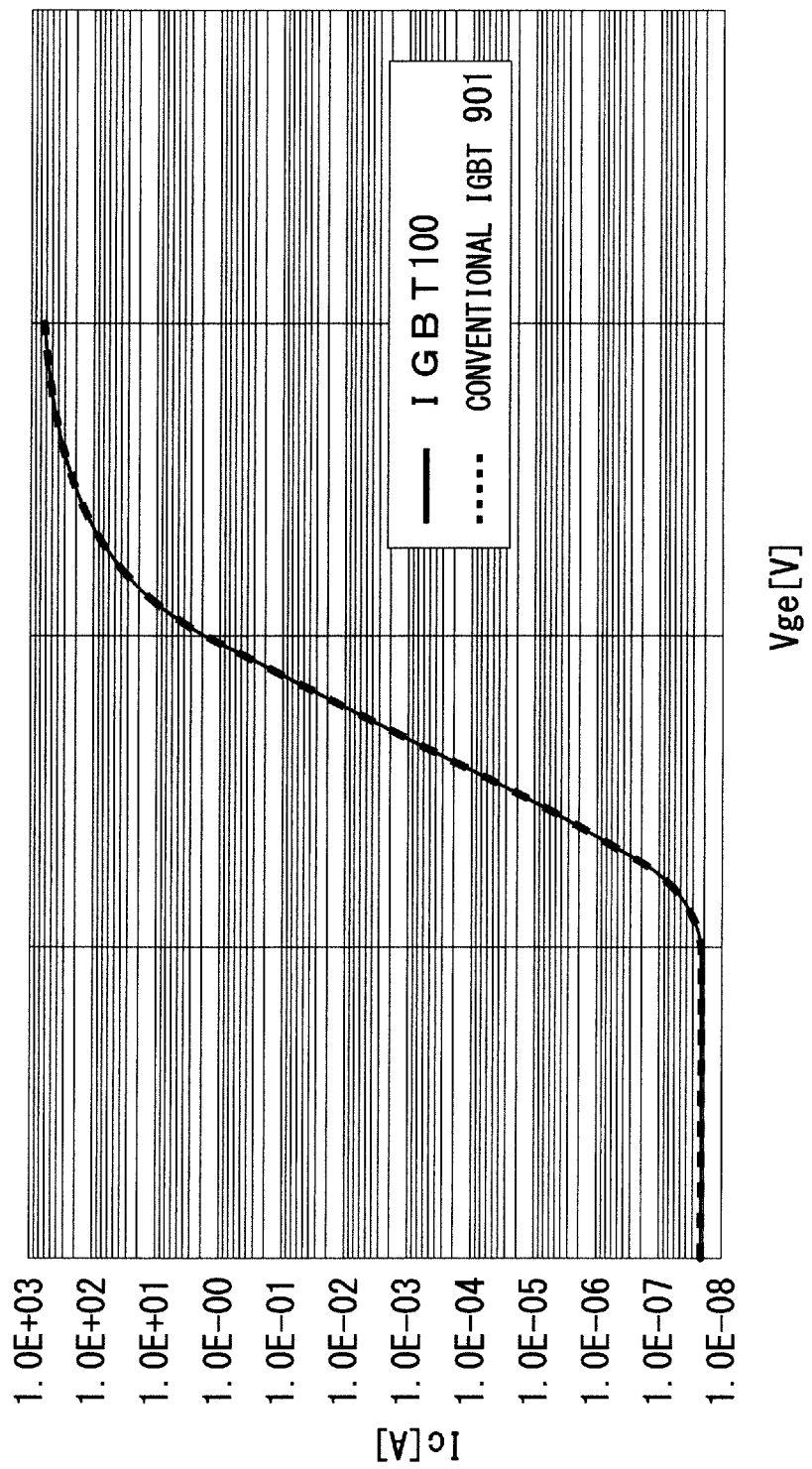

F I G. 1 6
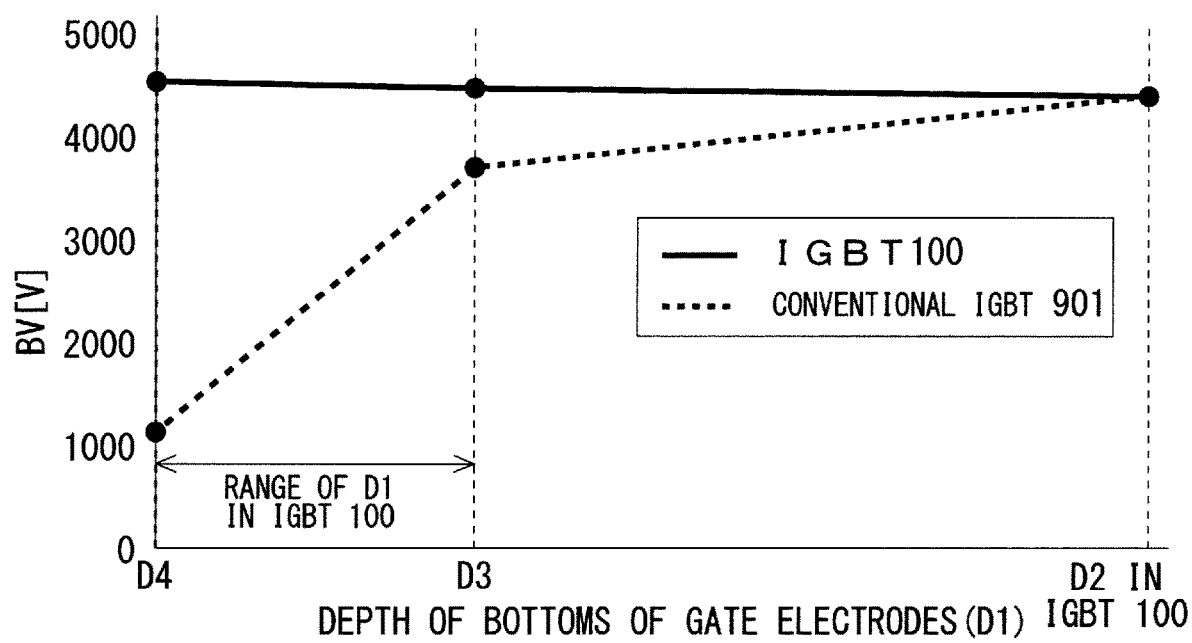

SEMICONDUCTOR DEVICE AND POWER CONVERTER

BACKGROUND OF THE INVENTION

Field of the Invention

The present invention relates to a semiconductor device including an insulated gate bipolar transistor.

Description of the Background Art

Trench gate type insulated gate bipolar transistors (IGBTs) are known to have structures applying an N-type carrier storage (CS) layer for the purpose of reducing an ON-state voltage (see International Publication WO/2002/58160, Japanese Patent Application Laid-Open No. 2017-143195, and Japanese Patent Application Laid-Open No. 2008-21918, for example).

In such an IGBT including the carrier storage layer, the carrier storage layer serves as a barrier to holes injected from the collector side in the ON state, thereby accelerating the accumulation of holes on the collector side of a semiconductor substrate. The carrier storage layer also brings about the effect of enhancing electron injection because electrons are accumulated at interfaces between the carrier storage layer and the trenches of gate electrodes when a positive voltage is applied to the gate electrodes. As a result, the carrier density in the semiconductor substrate increases, and the ON-state voltage decreases.

The trench gate-type IGBT includes a parasitic capacitance (referred to, for example, a "gate-collector capacitance" or a "mirror capacitance") between the gate and collector electrodes. In the structure including the carrier storage layer, the gate-collector capacitance increases with increasing area of contact between the carrier storage layer and a gate oxide film. The increase in gate-collector capacitance leads to a decrease in turn-on and turn-off speeds of the IGBT and an increase in switching loss. Also, the gate voltage oscillates as a result of being affected by variations in the collector-emitter voltage via the gate-collector capacitance. The oscillation of the gate voltage may incur a breakage or malfunction of devices.

As a method of reducing the gate-collector capacitance, it is conceivable to reduce the depth of the trenches of the gate electrodes in order to reduce the area of contact between the carrier storage layer and the gate oxide film and thereby reduce the gate-collector capacitance. However, if the depth of the gate electrodes embedded in the trenches becomes smaller than the depth of the carrier storage layer, field plate effects of adjacent trenches will become weak. This causes an electric field concentration at the carrier storage layer and dramatically reduces voltage endurance.

Therefore, it is difficult for the trench gate-type IGBTs including the carrier storage layer to achieve both reducing the gate-collector capacitance and reducing the ON-state voltage as well as maintaining voltage endurance.

SUMMARY

It is an object of the present invention to provide a semiconductor device capable of reducing switching loss while reducing the ON-state voltage and maintaining voltage endurance.

A semiconductor device according to a first aspect of the present invention includes a semiconductor substrate of a first conductivity type, gate trenches formed on an upper surface side of the semiconductor substrate, gate electrodes embedded in the gate trenches, a gate insulating film interposed between the gate electrodes and the semiconductor substrate, a channel layer of a second conductivity type formed in a surface portion on the upper surface side of the semiconductor substrate, a contact layer of the second conductivity type formed in a surface portion of the channel layer and having a higher peak impurity concentration than the channel layer, an emitter layer of the first conductivity type formed adjacent to the gate trenches in the surface portion of the channel layer, a carrier storage layer of the first conductivity type formed below the channel layer, a collector layer of the second conductivity type formed on a lower surface side of the semiconductor substrate, a dummy gate trench formed between two adjacent ones of the gate trenches on the upper surface side of the semiconductor substrate, dummy gate electrodes embedded in the dummy gate trenches, and a dummy gate insulating film interposed between the dummy gate electrodes and the semiconductor substrate. A relationship $D4<D1<D3<D2$ holds true, where $D1$ is a depth of bottoms of the gate electrodes, $D2$ is a depth of bottoms of the dummy gate electrodes, $D3$ is a depth of a bottom of the carrier storage layer, and $D4$ is a depth of a junction between the channel layer and the carrier storage layer.

A semiconductor device according to a second aspect of the present invention includes a semiconductor substrate of a first conductivity type, gate trenches formed on an upper surface side of the semiconductor substrate, gate electrodes embedded in the gate trenches, a gate insulating film interposed between the gate electrodes and the semiconductor substrate, a channel layer of a second conductivity type formed in a surface portion on the upper surface side of the semiconductor substrate, a contact layer of the second conductivity type formed in a surface portion of the channel layer and having a higher peak impurity concentration than the channel layer, an emitter layer of the first conductivity type formed adjacent to the gate trenches in the surface portion of the channel layer, a carrier storage layer of the first conductivity type formed below the channel layer, and a collector layer of the second conductivity type formed on a lower surface side of the semiconductor substrate. Some of the gate trenches are formed shallower than the other gate trenches, and a relationship $D4<D1<D3<D2$ holds true, where $D1$ is a depth of bottoms of gate electrodes embedded in shallow gate trenches, $D2$ is a depth of bottoms of gate electrodes embedded in deep gate trenches, $D3$ is a depth of a bottom of the carrier storage layer, and $D4$ is a depth of a bottom of a junction between the channel layer and the carrier storage layer.

According to the present invention, it is possible to reduce switching loss while effecting a reduction in ON-state voltage with the presence of the carrier storage layer and maintaining voltage endurance induced by the field plate effects of the dummy gate electrodes.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 illustrates a structure of a semiconductor device according to a first preferred embodiment.

FIG. 15 is a graph showing output characteristic of the conventional IGBT and the IGBT according to the first preferred embodiment;

FIG. 16 is a graph showing voltage endurance characteristics of the conventional IGBT and the IGBT according to the first preferred embodiment;

DESCRIPTION OF THE PREFERRED EMBODIMENTS

First Preferred Embodiment

Figure 2:
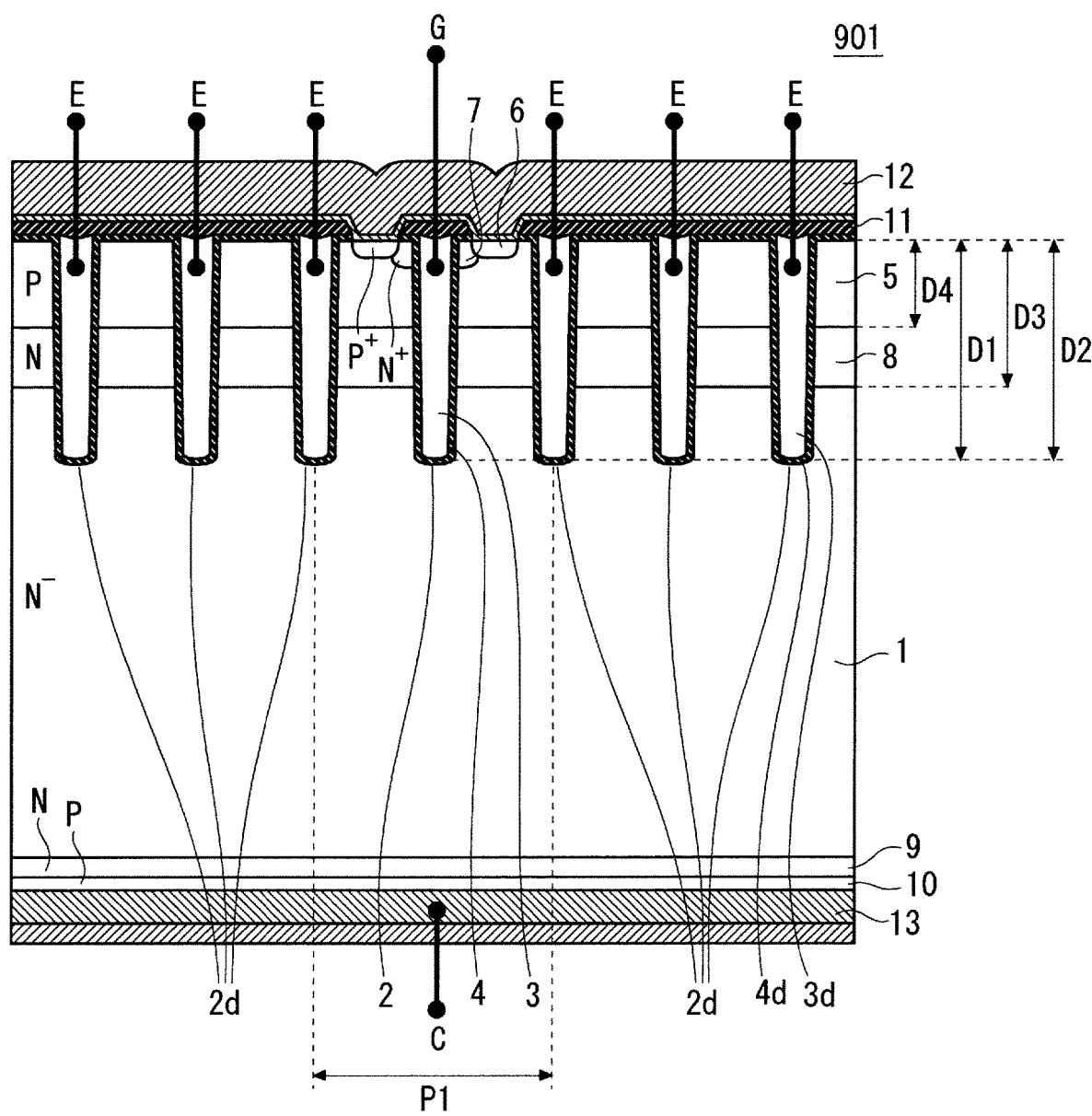
FIG. 2 illustrates an example of a conventional IGBT.

FIG. 1 illustrates a structure of a trench gate-type IGBT 100 that is a semiconductor device according to a first preferred embodiment. The following description is given assuming that a first conductivity type is an N type, and a second conductivity type is a P type. The IGBT 100 as illustrated herein is a high withstand voltage class IGBT having a withstand voltage of 3300V, but the withstand voltage class is not limited to this example.

The IGBT 100 uses a semiconductor substrate 1 made of N⁻-type silicon. Here, the upper-side (emitter-side) surface of the semiconductor substrate 1 in FIG. 1 is defined as an "upper surface," and the lower-side (collector-side) surface as a "lower surface."

The semiconductor substrate 1 has gate trenches 2 on the upper surface side. Although FIG. 1 shows only one gate trench 2, the semiconductor substrate 1 has a plurality of gate trenches 2 at regular intervals.

Each gate trench 2 has a gate electrode 3 embedded therein. The gate electrodes 3 are made of, for example, polysilicon. Between the gate electrodes 3 and the semiconductor substrate 1, a gate insulating film 4 made of, for example, silicon oxide is interposed. That is, the gate insulating film 4 is formed on the side walls and bottoms of the gate trenches 2.

The semiconductor substrate 1 has a P-type channel layer 5 formed in the surface portion on the upper surface side. In the surface portion of the channel layer 5, a P$^+$-type contact layer 6 and an N$^+$-type emitter layer 7 are formed, the contact layer 6 having a higher peak impurity concentration than the channel layer 5, and the emitter layer 7 having a higher peak impurity concentration than the semiconductor substrate 1. The emitter layer 7 is disposed adjacent to the gate trenches 2. Also, an N-type carrier storage layer 8 is formed under the channel layer 5.

The table below gives tolerances of the peak impurity concentrations in the semiconductor substrate 1, the channel layer 5, and the carrier storage layer 8.

TABLE 1

| | Tolerances of Peak Concentrations [cm$^{-3}$] |
|---|---|
| Semiconductor Substrate | 10$^{12}$ to 10$^{14}$ |
| Channel Layer | 10$^{16}$ to 10$^{17}$ |
| Carrier Storage Layer | 10$^{15}$ to 10$^{16}$ |

The semiconductor substrate 1 has a P-type collector layer 10 formed in the surface portion on the lower surface side. Also, an N-type buffer region 9 having a higher peak impurity concentration than the semiconductor substrate 1 is formed on the upper side of the collector layer 10, i.e., between the collector layer 10 and an if-type region of the semiconductor substrate 1.

On the upper surface side of the semiconductor substrate 1, dummy gate trenches 2d are formed between two adjacent gate trenches 2. At least one dummy gate trench 2d is formed therebetween.

Each dummy gate trench 2d has a dummy gate electrode 3d embedded therein. Between the dummy gate electrodes 3d and the semiconductor substrate 1, a dummy gate insulating film 4d is interposed. That is, the dummy gate insulating film 4d is formed on the side walls and bottoms of the dummy gate trenches 2d.

The emitter layer 7 is not formed on both sides of the dummy gate trenches 2d.

According to the present preferred embodiment, the dummy gate electrodes 3d are connected to an emitter electrode 12 in a region not shown. The dummy gate electrodes 3d are thus electrically connected to the emitter layer 7 via the emitter electrode 12. From this, the dummy gate electrodes 3d do not function as gate electrodes of the IGBT 100.

On the upper surface of the semiconductor substrate 1, an interlayer insulation film 11 is formed so as to cover the gate electrodes 3 and the dummy gate electrodes 3d. The emitter electrode 12 is formed on the interlayer insulation film 11. The interlayer insulation film 11 has contact holes that reach the contact layer 6. The emitter electrode 12 is connected through these contact holes to the contact layer 6. On the lower surface of the semiconductor substrate 1, a collector electrode 13 is formed. The emitter electrode 12 and the collector electrode 13 may have, for example, a laminated structure formed of a plurality of metal films, including barrier metal, as illustrated in FIG. 1.

A relationship D4<D1<D3<D2 holds true, where D1 is the depth of the bottoms of the gate electrodes 3 (distance from the upper surface of the semiconductor substrate 1), D2 is the depth of the bottoms of the dummy gate electrodes 3d, D3 is the depth of the bottom of carrier storage layer 8 (junction between the carrier storage layer 8 and the N$^-$-type region of the semiconductor substrate 1), and D4 is the depth of the bottom of the channel layer 5 (junction between the channel layer 5 and the carrier storage layer 8), as illustrated in FIG. 1.

The interval between two adjacent dummy gate electrodes 3d that sandwich a gate electrode 3 therebetween is preferably less than or equal to 15 μm. That is, a relationship P1≤15 μm preferably holds true, where P1 is the interval between two adjacent dummy gate electrodes 3d that sandwich a gate electrode 3 therebetween.

Advantageous effects achieved by the IGBT 100 according to the first preferred embodiment will be described. Effects achieved by the IGBT 100 are hereinafter described by comparison with the cases of conventional IGBTs illustrated in FIGS. 2 to 4.

A conventional IGBT 901 illustrated in FIG. 2 is configured such that the depth D1 of the bottoms of the gate electrodes 3 is equal to the depth D2 of the bottoms of the dummy gate electrodes 3d. That is, a relationship D1=D2 holds true for the conventional IGBT 901.

Figure 3:
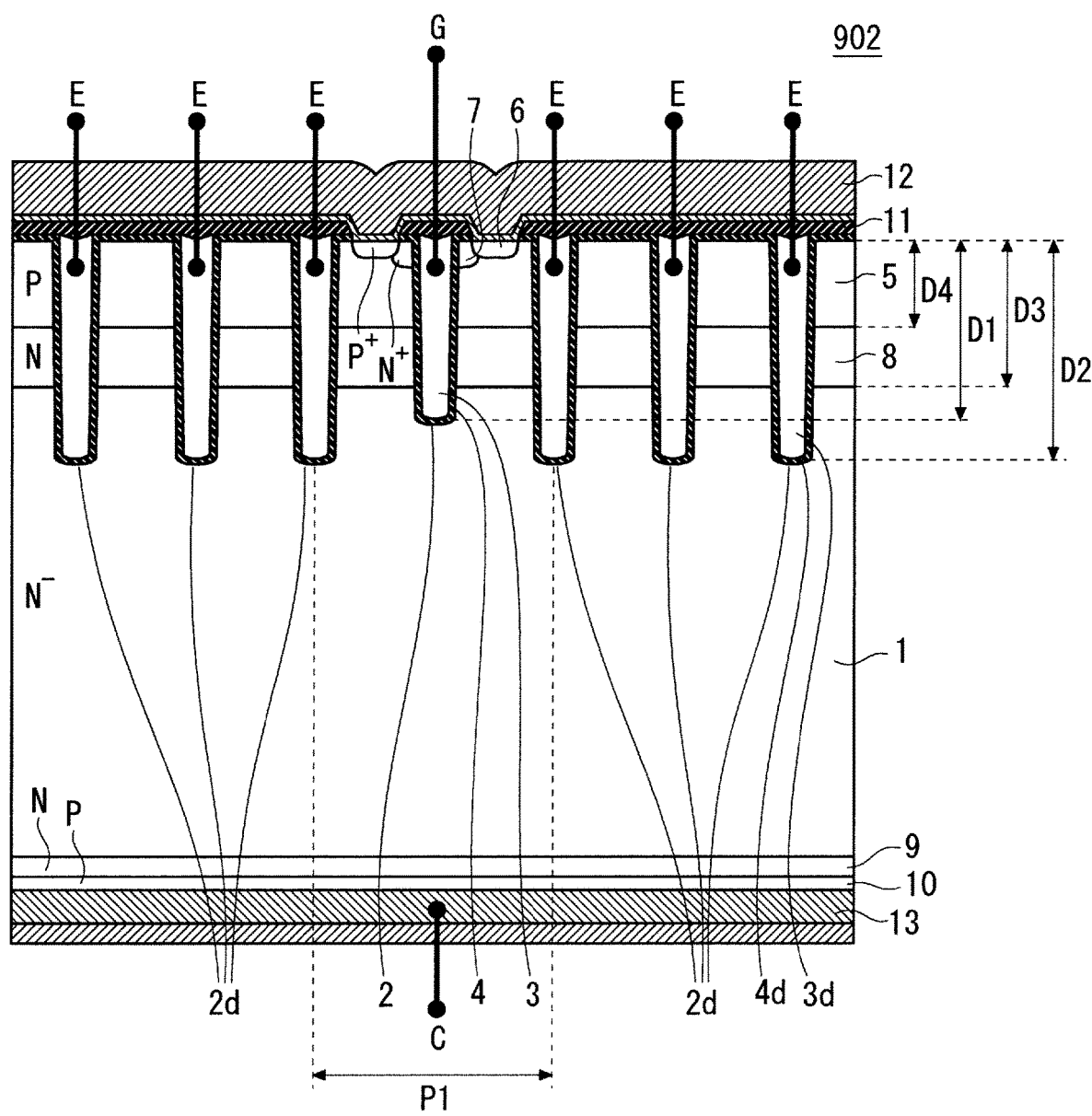
FIG. 3 illustrates an example of a conventional IGBT.

A conventional IGBT 902 illustrated in FIG. 3 is configured such that the depth D1 of the bottoms of the gate electrodes 3 is smaller than the depth D2 of the bottoms of the dummy gate electrodes 3d and is greater than the depth D3 of the bottom of the carrier storage layer 8. That is, a relationship D4<D3<D1<D2 holds true for the conventional IGBT 902.

Figure 4:
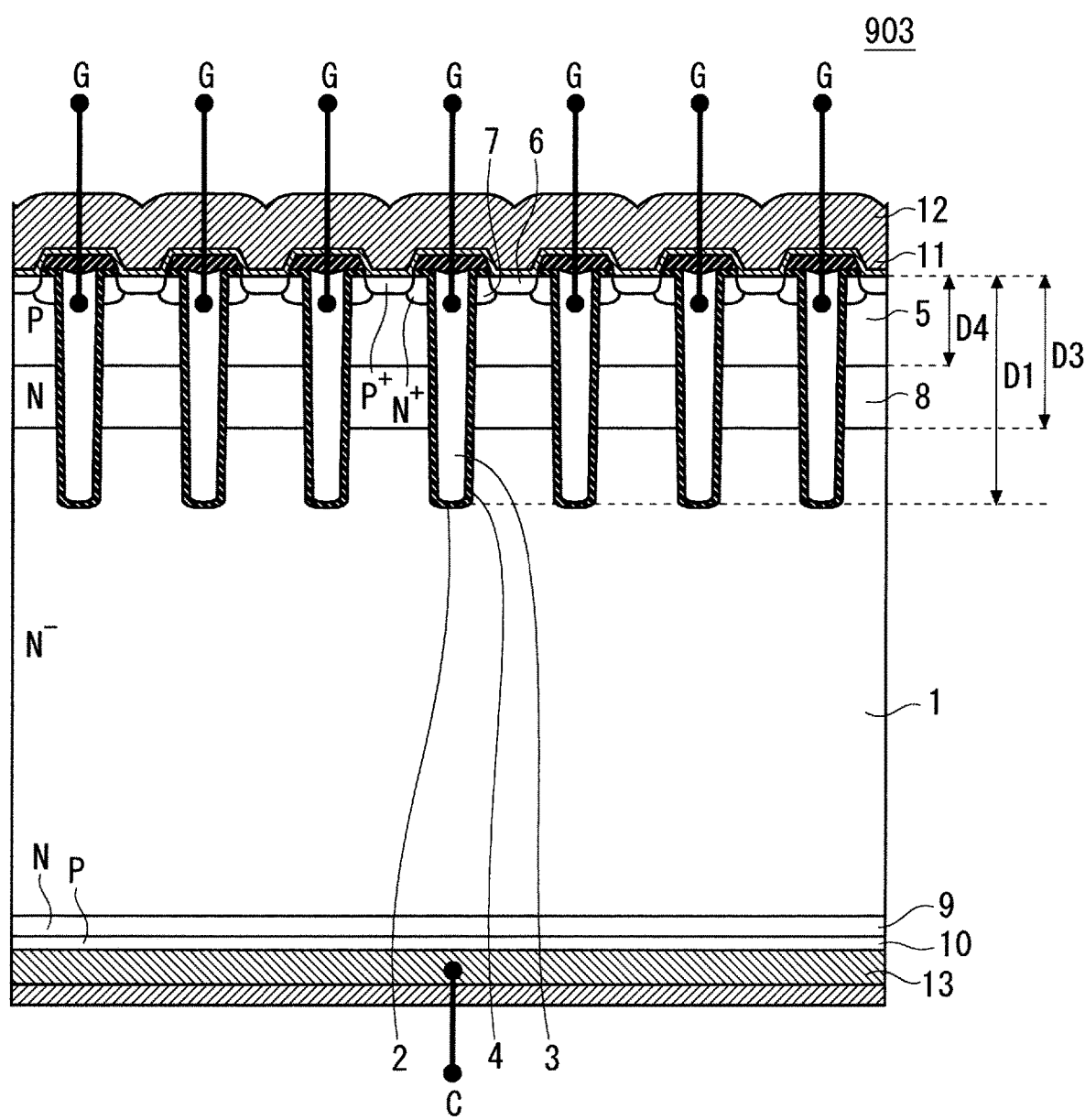
FIG. 4 illustrates an example of a conventional IGBT.

A conventional IGBT 903 illustrated in FIG. 4 includes no dummy gate electrodes 3d. In the conventional IGBT 903, the bottoms of a plurality of gate electrodes 3 all have the same depth.

Figure 5:
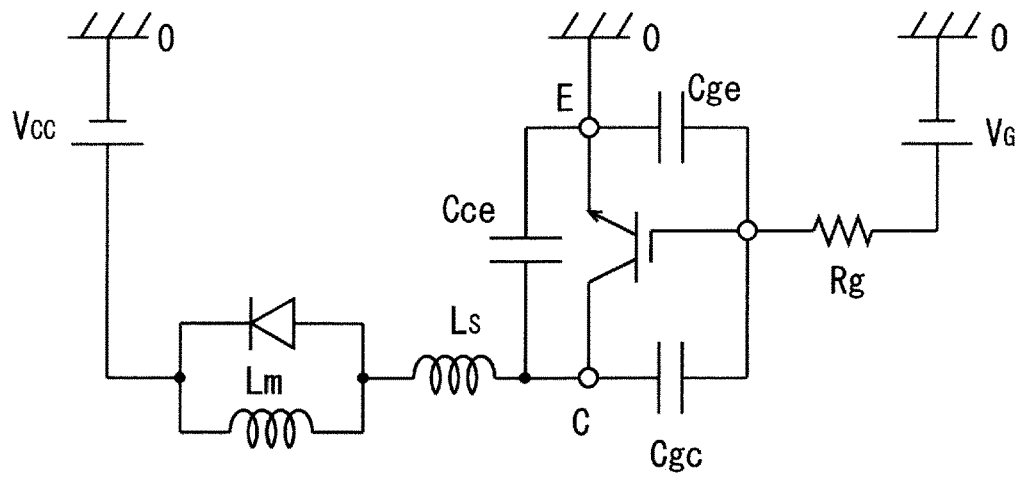
FIG. 5 illustrates a switching equivalent circuit of an IGBT.

FIG. 5 illustrates a switching equivalent circuit of the IGBT. In FIG. 5, Lm is the load inductance, Rg is the gate resistance, Ls is the parasitic inductance in the circuit, Cge is the gate-emitter parasitic capacitance, Cce is the emitter-collector parasitic capacitance, and Cgc is the gate-collector parasitic capacitance. This circuit oscillates more easily when the temperature of the IGBT drops, a power supply voltage Vcc increases, and the parasitic inductance Ls in the circuit increases.

FIGS. 6 to 9 are graphs showing switching characteristics of the conventional IGBTs 901 and 902 and the IGBT 100 according to the first preferred embodiment. In FIGS. 6 to 9, each IGBT has a fixed cell pitch (unless otherwise specified, each IGBT also has a fixed cell pitch in subsequent graphs described later).

Figure 6:
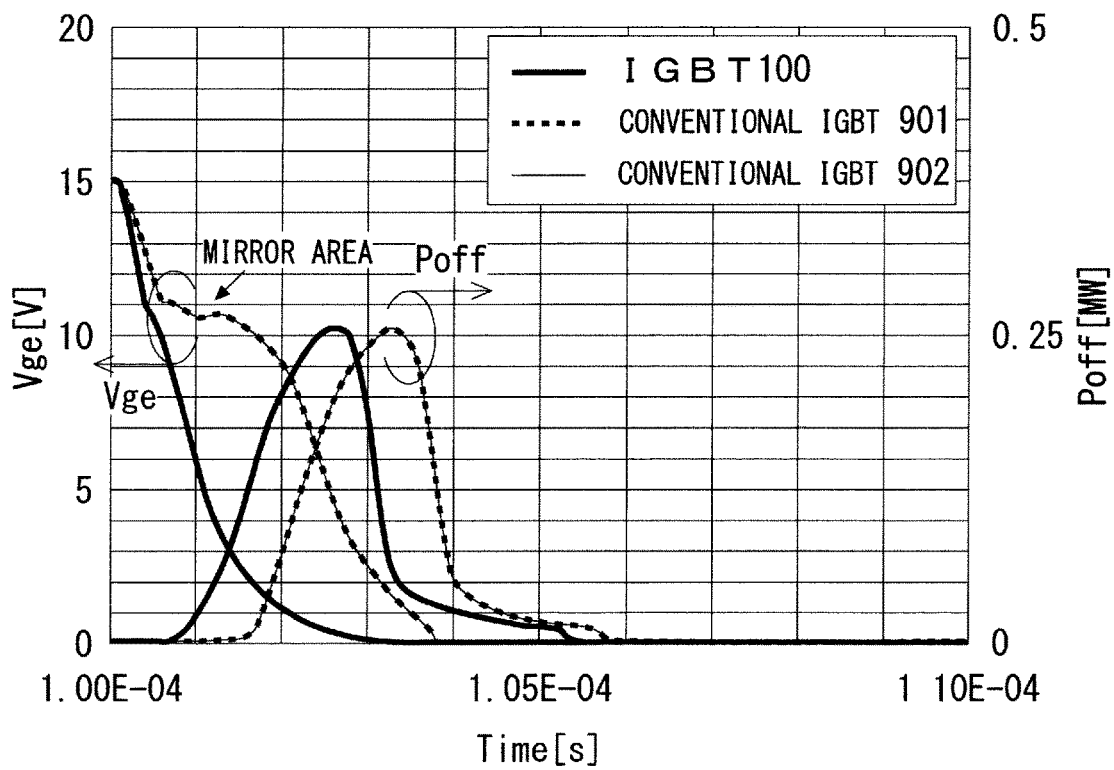
FIG. 6 is a graph showing switching characteristics of the conventional IGBTs and the IGBT according to the first preferred embodiment.
Figure 7:
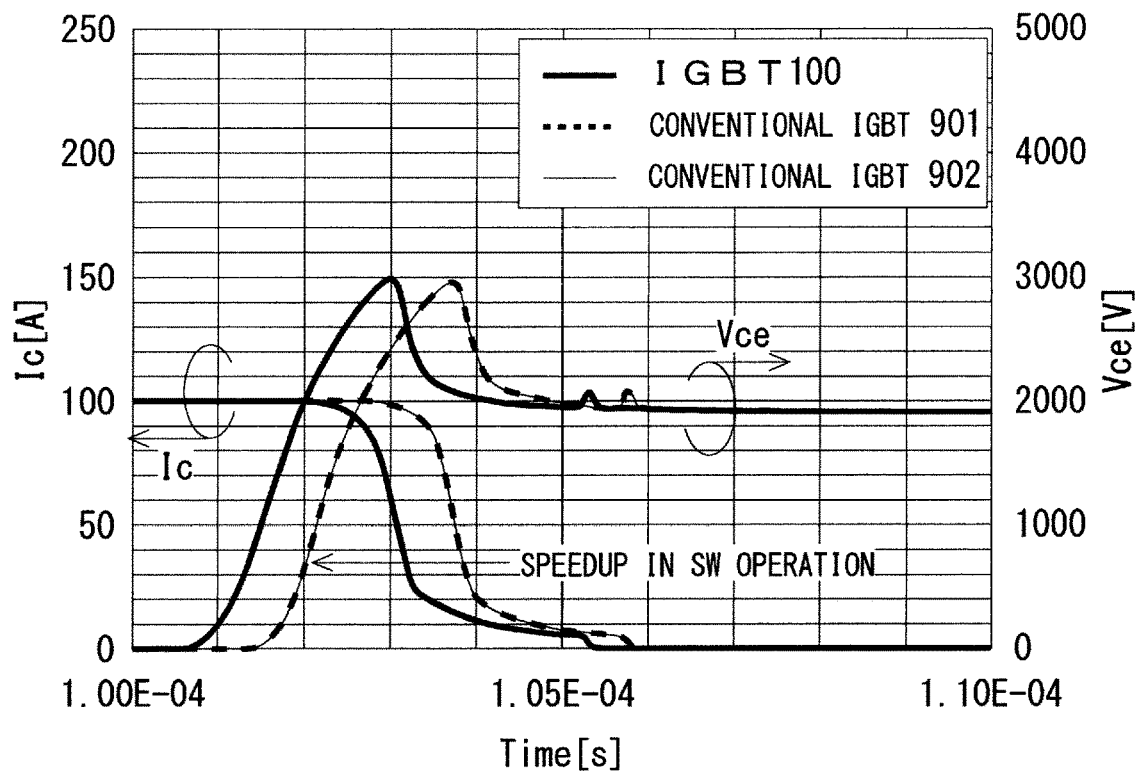
FIG. 7 is a graph showing switching characteristics of the conventional IGBTs and the IGBT according to the first preferred embodiment.

FIG. 6 illustrates waveforms of the gate-emitter voltage Vge and turn-off loss Poff at turn-off. FIG. 7 illustrates waveforms of the collector current Ic and the collector-emitter voltage Vce at turn-off.

The gate-collector parasitic capacitance Cgc decreases as the depth of the gate trench 2 decreases. Thus, the Miller region of the IGBT 100 at turn-off is shorter than those of the conventional IGBTs 901 and 902, as illustrated in FIG. 6. The switching speed of the IGBT 100 at turn-off is thus faster than those of the conventional IGBTs 901 and 902, as illustrated in FIG. 7. On the other hand, the conventional IGBTs 901 and 902 show no differences in waveforms illustrated in FIGS. 6 and 7 because they have the same area of contact between the carrier storage layer 8 and the gate trenches 2.

Figure 8:
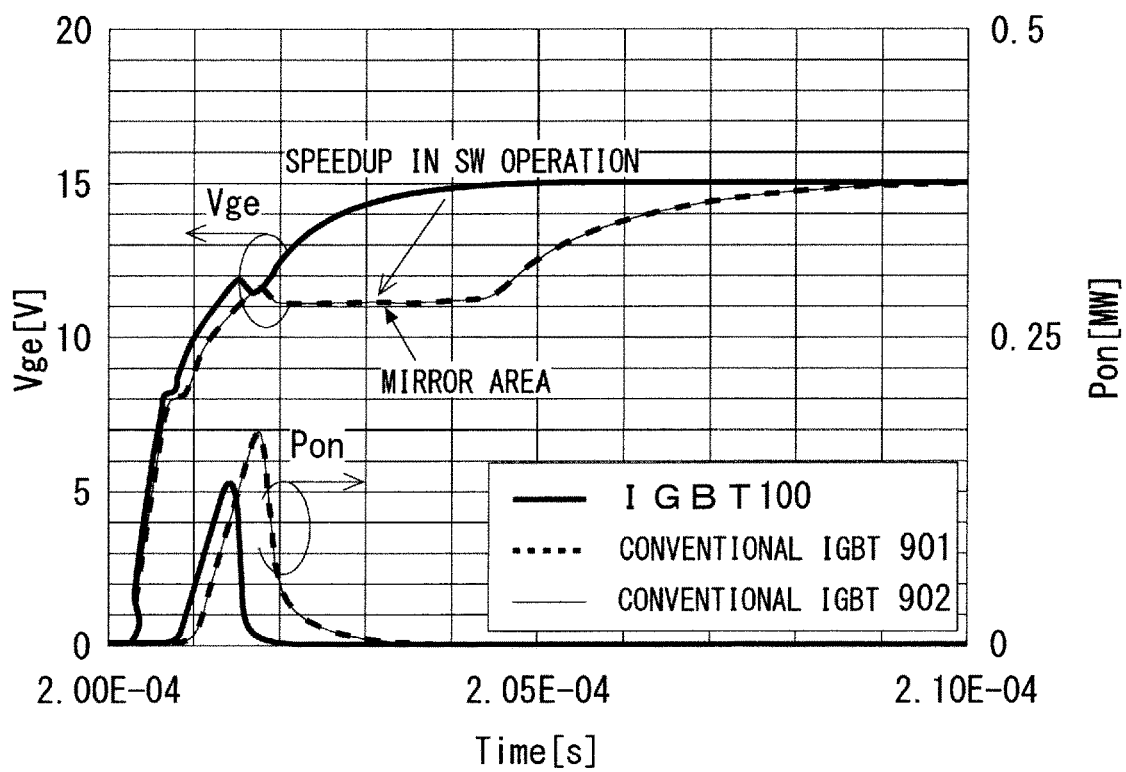
FIG. 8 is a graph showing switching characteristics of the conventional IGBTs and the IGBT according to the first preferred embodiment.
Figure 9:
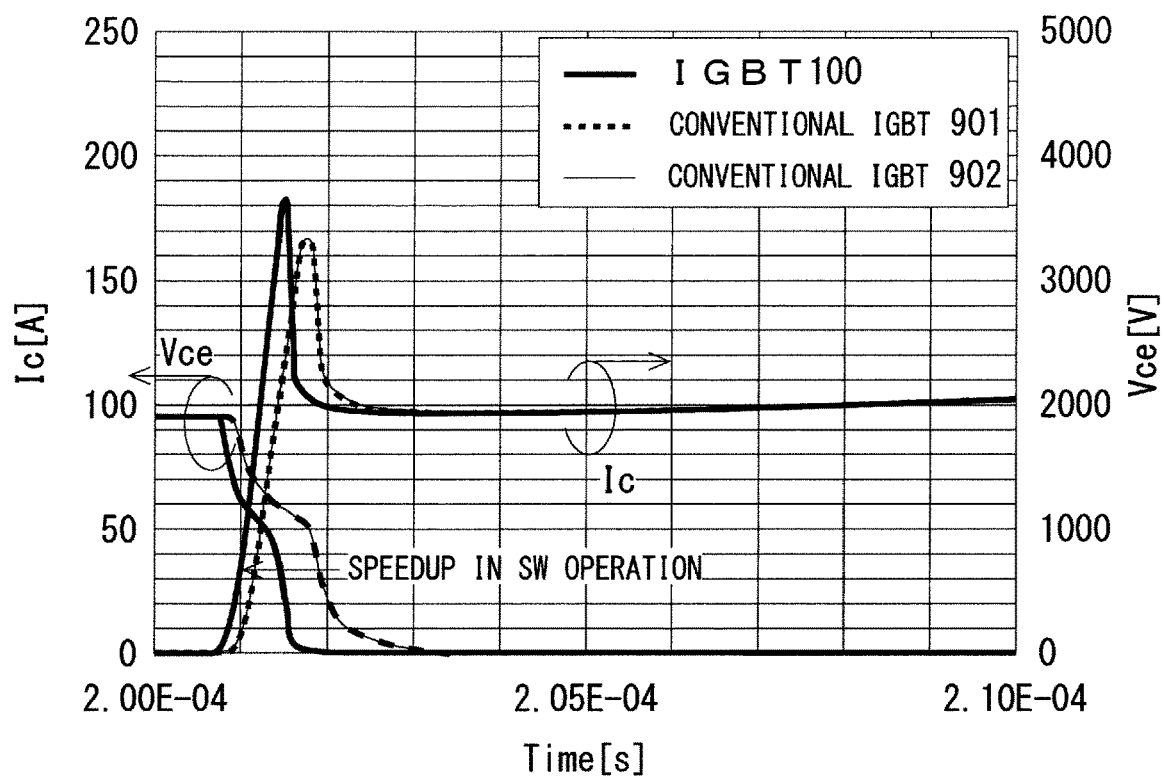
FIG. 9 is a graph showing switching characteristics of the conventional IGBTs and the IGBT according to the first preferred embodiment.

FIG. 8 illustrates waveforms of the gate-emitter voltage Vge and turn-on loss Pon at turn-on. FIG. 9 illustrates waveforms of the collector current Ic and the collector-emitter voltage Vce at turn-on.

The Miller region of the IGBT 100 at turn-on is also shorter than those of the conventional IGBTs 901 and 902, as illustrated in FIG. 8, because the gate-collector parasitic capacitance Cgc decreases in the IGBT 100. Thus, the switching speed of the IGBT 100 at turn-on is also faster than those of the conventional IGBTs 901 and 902, as illustrated in FIG. 9. On the other hand, the conventional IGBTs 901 and 902 show no differences in waveforms illustrated in FIGS. 8 and 9 because they have the same area of contact between the carrier storage layer 8 and the gate trenches 2.

Figure 10:
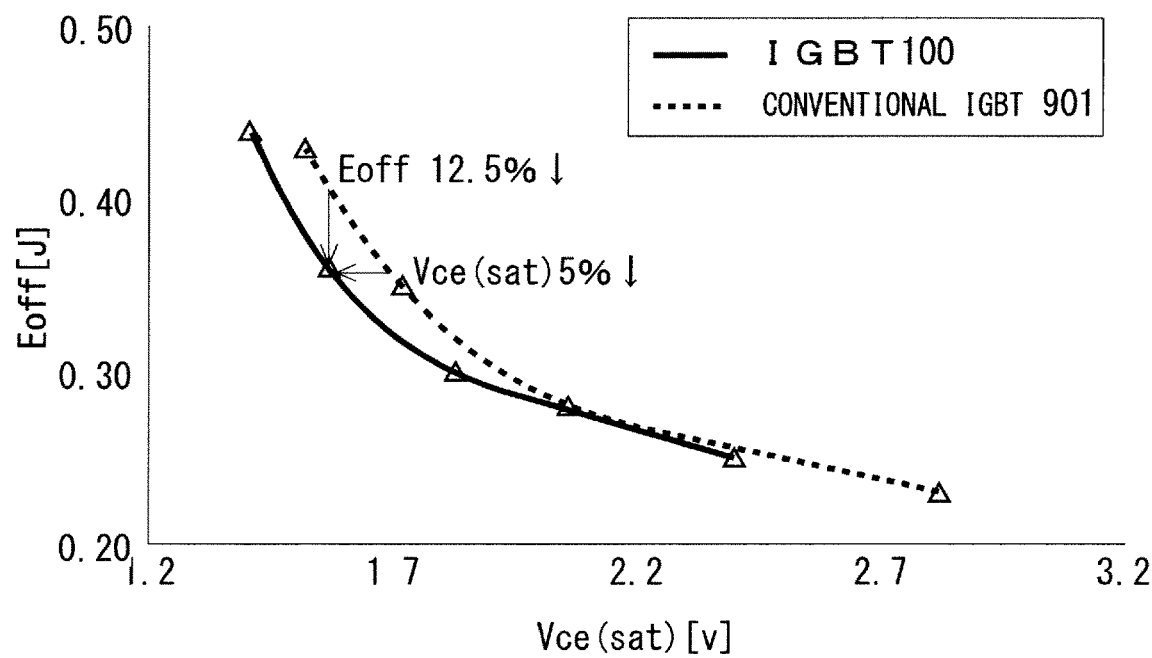
FIG. 10 is a graph showing trade-off characteristics between a collector-emitter saturation voltage and a turn-off loss of the conventional IGBT and the IGBT according to the first preferred embodiment.

FIG. 10 is a graph showing trade-off characteristics between a collector-emitter saturation voltage Vce(sat) and turn-off loss Eoff of the conventional IGBT 901 and the IGBT 100 according to the first preferred embodiment. The graph shows that the IGBT 100 according to the first preferred embodiment can reduce the collector-emitter saturation voltage Vce (sat) by 5% and the turn-off loss Eoff by approximately 12.5% from those of the conventional IGBT 901.

Figure 11:
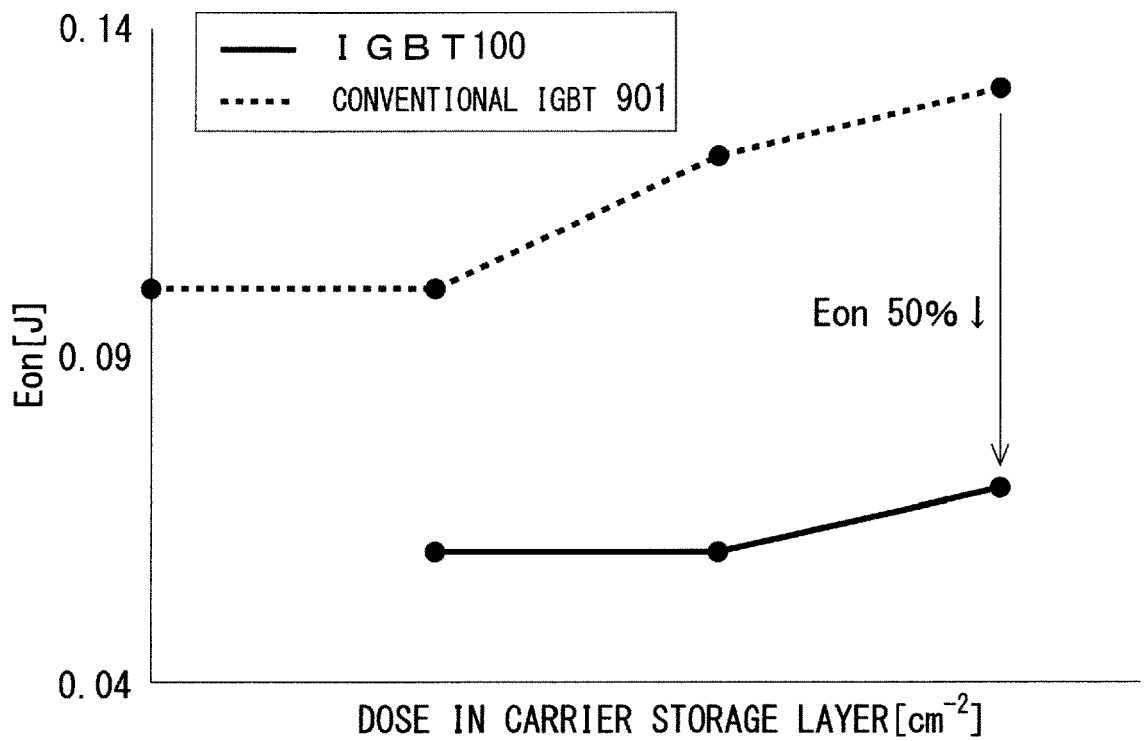
FIG. 11 is a graph showing the dependence of a turn-on loss on the dose in a carrier storage layer between the conventional IGBT and the IGBT according to the first preferred embodiment.

FIG. 11 is a graph showing the dependence of the turn-on loss Eon on the dose of impurities in the carrier storage layer 8 in the conventional IGBT 901 and the IGBT 100 according to the first preferred embodiment. The graph shows that the IGBT 100 can reduce the turn-on loss Eon by 50% from that of the conventional IGBT 901.

Figure 12:
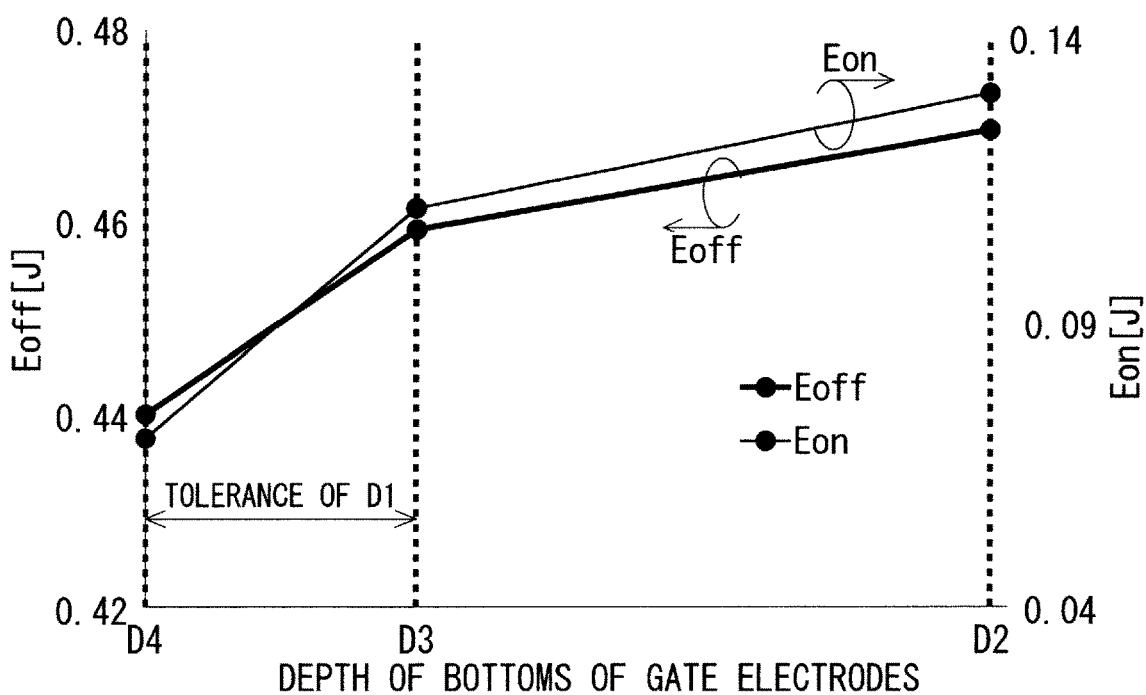
FIG. 12 is a graph showing the dependence of the turn-off loss and the turn-on loss on the depth of gate electrodes in the IGBT according to the first preferred embodiment.

FIG. 12 is a graph showing the dependence of the turn-off loss Eoff and the turn-on loss Eon on the depth of the gate electrodes 3 in the IGBT 100 according to the first preferred embodiment. The graph shows that the turn-off loss Eoff and the turn-on loss Eon decrease as the depth of the bottoms of the gate electrodes 3 decreases.

Figure 13:
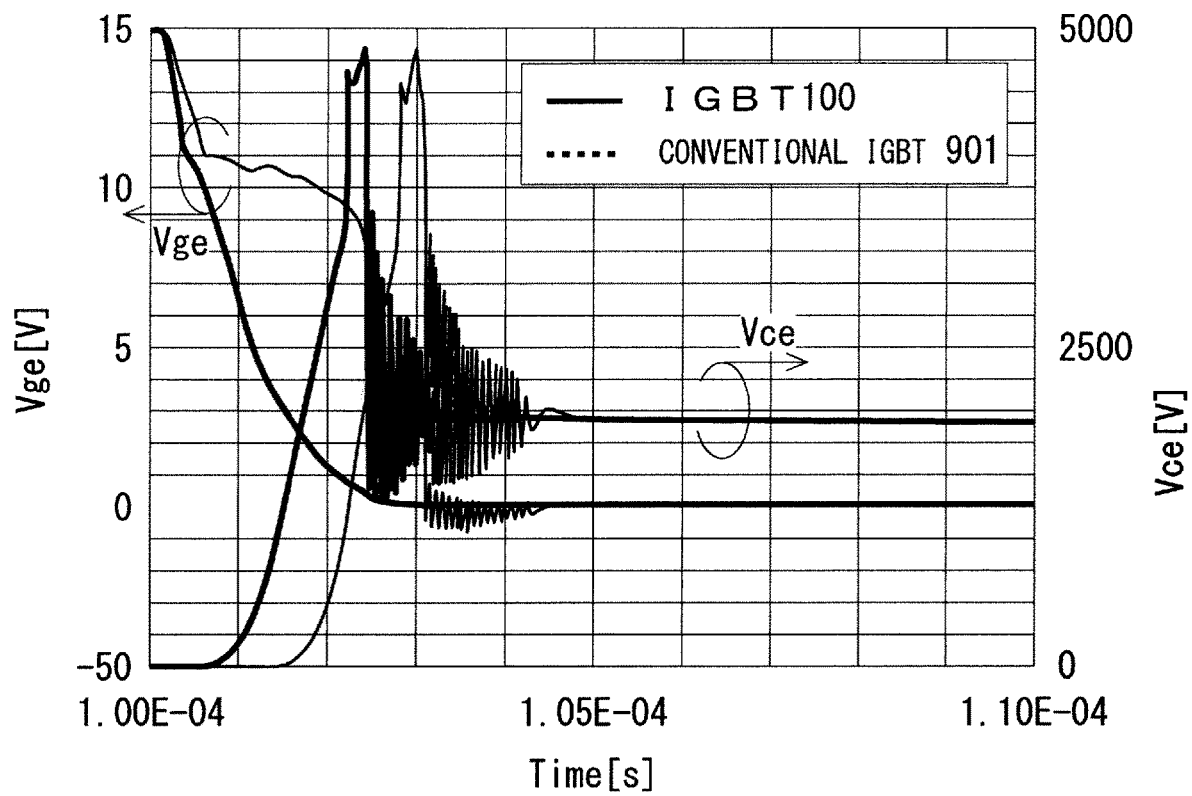
FIG. 13 is a graph showing turn-off waveforms observed when the conventional IGBT and the IGBT according to the first preferred embodiment are set to oscillation conditions.

FIG. 13 is a graph showing waveforms of the collector-emitter voltage Vce and the gate-emitter voltage Vge, observed when the conventional IGBT 901 and the IGBT 100 according to the first preferred embodiment were set to conditions for facilitating oscillations (oscillation conditions) and were turned off. The collector-emitter voltages Vce exhibited oscillations in both the IGBT 100 and the conventional IGBT 901. The gate-emitter voltage Vge exhibited oscillations in the conventional IGBT 901, but exhibited no oscillations in the IGBT 100. This is considered to be because since the gate trenches 2 are shallow in depth and the IGBT 100 has a small gate-collector parasitic capacitance Cgc, the gate-emitter voltage Vge is not easily affected by the oscillations of the collector-emitter voltage Vce.

The table below summarizes the switching characteristics of the IGBT 100 and the conventional IGBTs 901 and 902, which can be seen from FIGS. 10, 11, and 13. The values of the turn-off loss Eoff and the turn-on loss Eon in this table are standardized by the turn-off and turn-on losses of the conventional IGBT 901.

TABLE 2

|  | $E_{off}$ | $E_{on}$ | Oscillations of Gate-Emitter Voltage |
|---|---|---|---|
| IGBT 100 of First Preferred Embodiment | 87.5% | 50% | No Oscillations |
| Conventional IGBT 901 | 100% | 100% | Oscillations |
| Conventional IGBT 902 | 100% | 100% | Oscillations |

Next, characteristics other than the switching characteristics of the IGBT 100 according to the first preferred embodiment will be described.

Figure 14:
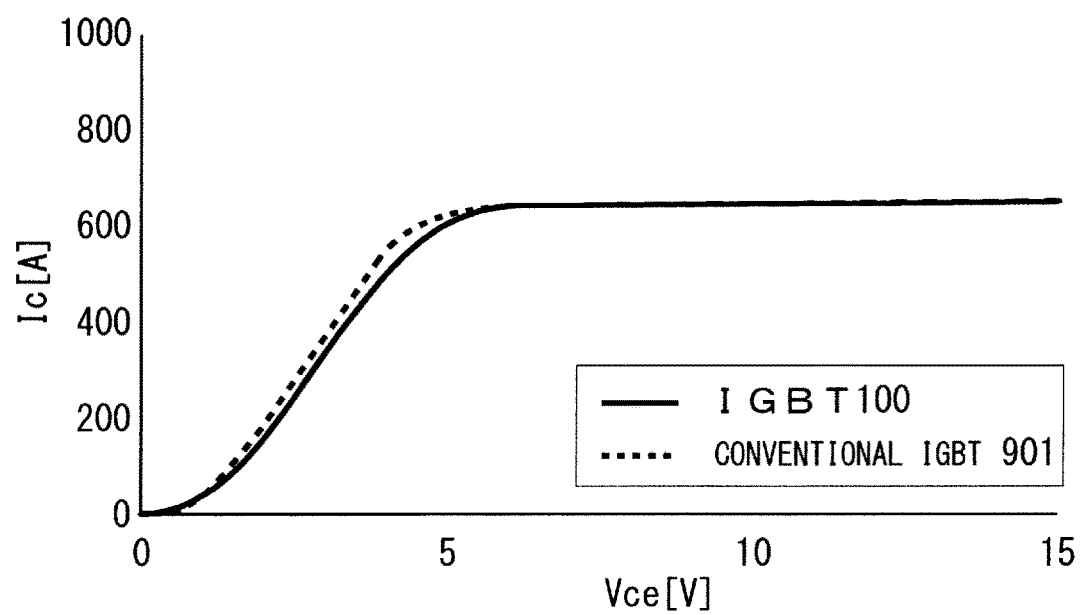
FIG. 14 is a graph showing output characteristics of the conventional IGBT and the IGBT according to the first preferred embodiment.

FIGS. 14 and 15 are graphs showing output characteristics of the conventional IGBT 901 and the IGBT 100 according to the first preferred embodiment. FIG. 14 illustrates the relationship between the collector current Ic and the collector-emitter voltage Vce (at a temperature of 150° C.), and FIG. 15 illustrates the relationship between the collector current Ic and the gate-emitter voltage Vge (at a temperature of 20° C.). The graphs show that the IGBT 100 has approximately the same output characteristics as those of the conventional IGBT 901.

FIG. 16 is a graph showing voltage endurance characteristics of the conventional IGBT 901 and the IGBT 100 according to the first preferred embodiment, and shows the dependence of the withstand voltage (BV) on the depth D1 of the bottoms of the gate electrodes 3. The graph shows that in the structure of the conventional IGBT 901 (structure in which D1=D2), the withstand voltage drops with a reduction in the depth D1 of the bottoms of the gate electrodes 3, and in particular, remarkably drops if the depth D1 becomes shallower than the depth D3 of the bottom of the carrier storage layer 8. In the case of the structure of the IGBT 100 (structure in which D1<D2), on the other hand, there is no drop in withstand voltage even if the depth D1 of the bottoms of the gate electrodes 3 is reduced. The withstand voltage rather increases slightly if the depth D1 of the bottoms of the gate electrodes 3 is reduced, because the field plate effects produced by the gate electrodes 3 and the adjacent dummy gate electrodes 3*d* become more evident.

Figure 17:
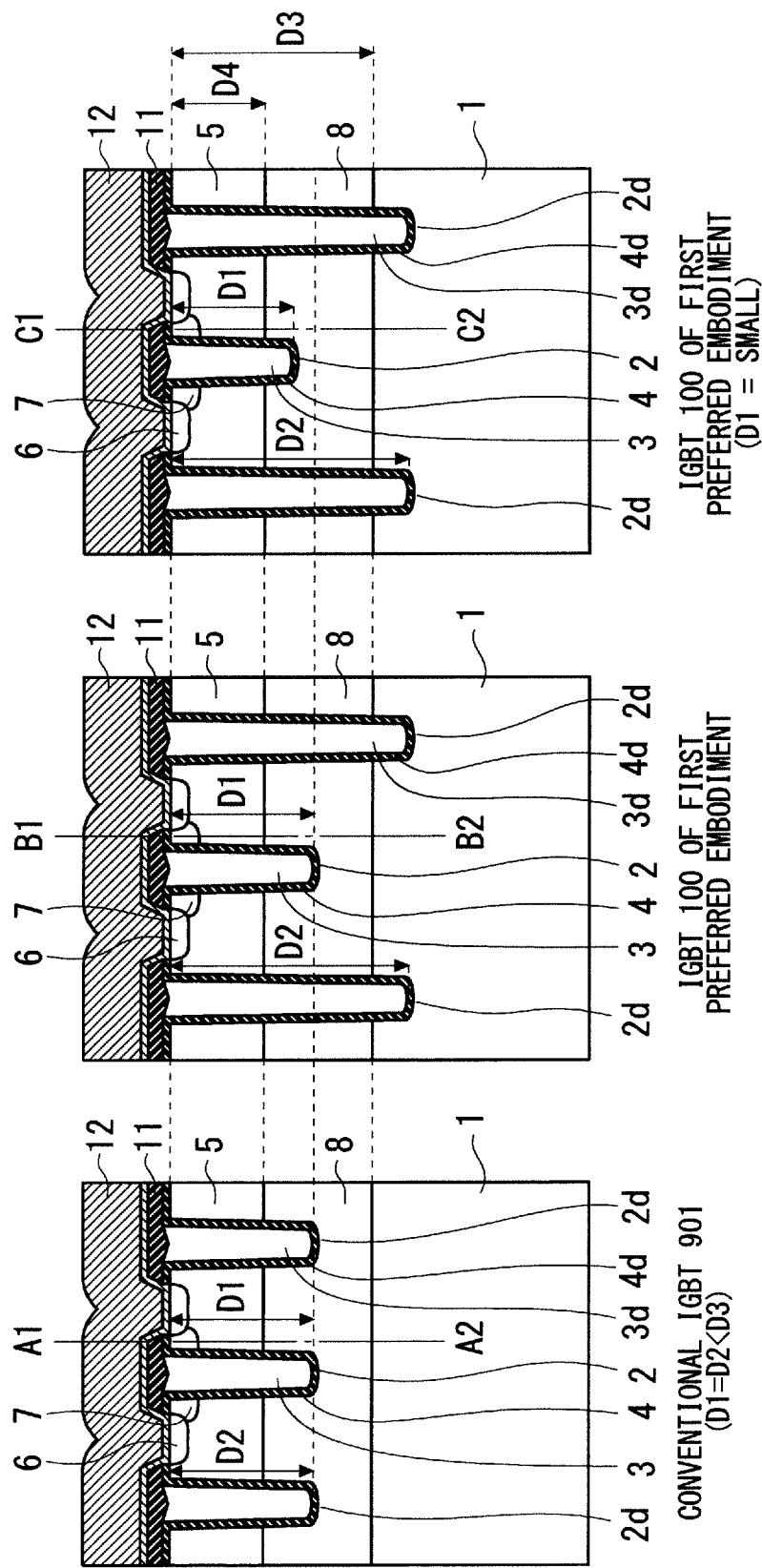
FIG. 17 illustrates example configurations of the major parts of the conventional IGBT and the IGBT according to the first preferred embodiment.

FIG. 17 illustrates example configurations of the major parts of the conventional IGBT 901 and the IGBT 100 according to the first preferred embodiment. Here, the depth D1 of the bottoms of the gate electrodes 3 and the depth D2 of the bottoms of the dummy gate electrodes 3*d* in the conventional IGBT 901 are set shallower than the depth D3 of the bottom of the carrier storage layer 8. FIG. 17 illustrates two example configurations of the IGBT 100 according to the first preferred embodiment. The IGBT 100 on the left side sets the depth D1 of the bottoms of the gate electrodes 3 to be the same as the depth D1 in the conventional IGBT 901. The IGBT 100 on the right side sets the depth D1 of the bottoms of the gate electrodes 3 to be smaller than the depth D1 in the conventional IGBT 901.

Figure 18:
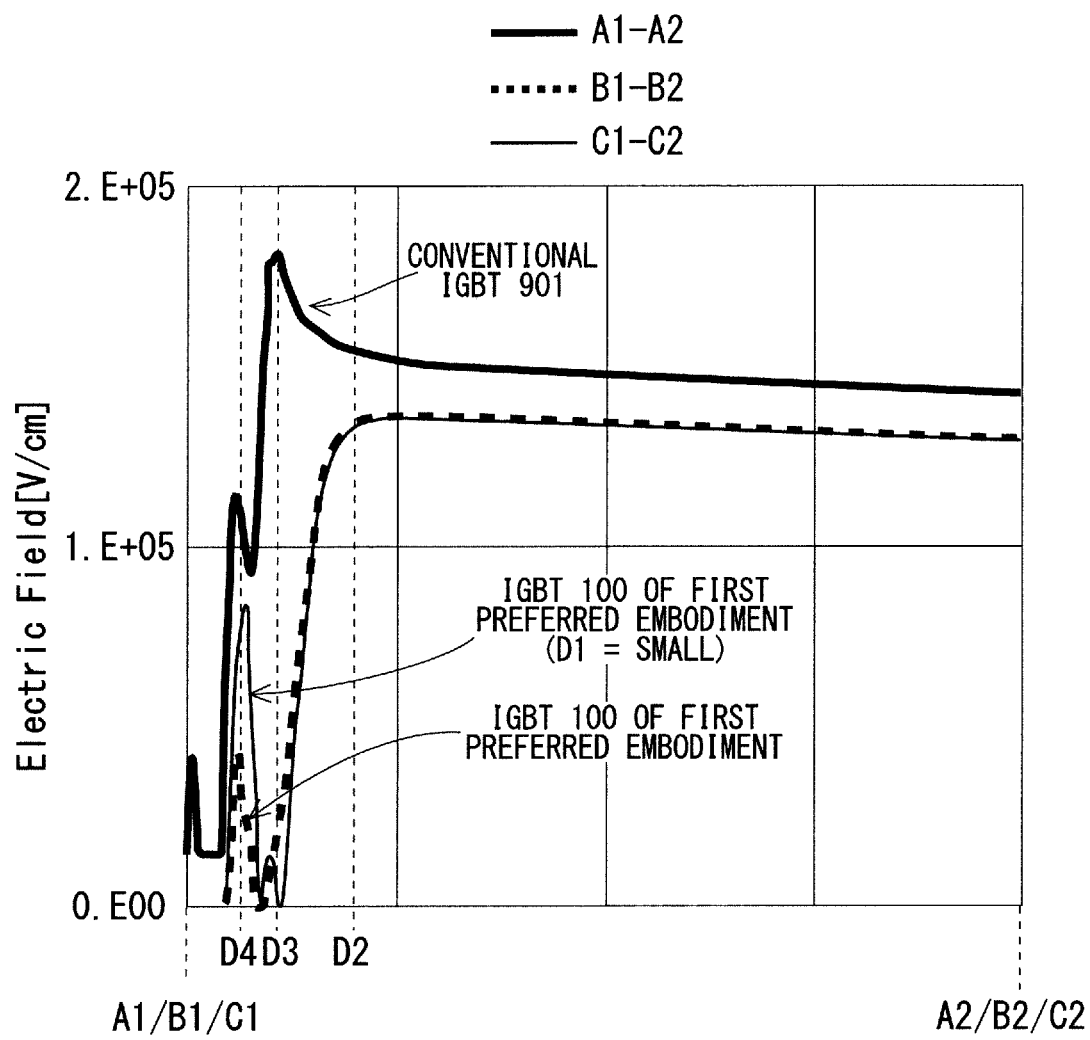
FIG. 18 is a graph showing electric field distributions of the conventional IGBT and the IGBT according to the first preferred embodiment.

FIG. 18 illustrates electric field distributions at positions along lines A1-A2, B1-B2, and C1-C2 when the same voltage is applied to the IGBT 100 and the conventional IGBT 901 illustrated in FIG. 17. In the case of the conventional IGBT 901, the electric field concentration occurs at the depth D3 of the bottom of the carrier storage layer 8 (electric field distribution indicated by line A1-A2); the withstand voltage is thereby limited. In the case of the IGBT 100 according to the first preferred embodiment, on the other hand, the peak of the electric field at the depth D3 of the bottom of the carrier storage layer 8 is suppressed by the field plate effects of the gate electrodes 3 and the adjacent dummy gate electrodes 3*d* (electric field distribution indicated by line B1-B2); the withstand voltage is thereby improved.

If the depth D1 of the bottoms of the gate electrodes 3 is further reduced, an electric field concentration appears at the depth D4 of the bottom of the channel layer 5 (electric field distribution indicated by line C1-C2). However, the peak of the electric field at the depth D4 of the bottom of the channel layer 5 is lower than that of the electric field at the depth D2 of the bottoms of the dummy gate electrodes 3*d* and therefore does not serve as a rate-limiting factor for the withstand voltage. The withstand voltage rather increases slightly with the presence of that peak because the integrated area of the graph of the electric field distribution increases when a voltage equivalent to the withstand voltage is applied.

As described previously, in the IGBT 100 according to the first preferred embodiment, the depth D1 of the bottoms of the gate electrodes 3, the depth D2 of the bottoms of the dummy gate electrodes 3*d*, the depth D3 of the bottom of the carrier storage layer 8, and the depth D4 of the bottom of the channel layer 5 have to satisfy the relationship D4<D1<D3<D2. This relationship will now be described in detail.

First, the depth D1 of the bottoms of the gate electrodes 3 has to be deeper than the depth D4 of the bottom of the channel layer 5 in order to establish an MOSFET structure within the IGBT 100. That is, a relationship D4<D1 has to be satisfied.

According to the present preferred embodiment, the gate-collector parasitic resistance Cgc is reduced by reducing the area of overlap between the gate electrodes 3 and the carrier storage layer 8 via the gate insulating film 4. Thus, the depth D1 of the bottoms of the gate electrodes 3 has to be smaller than the depth D3 of the bottom of the carrier storage layer 8. That is, a relationship D1<D3 has to be satisfied.

Moreover, field plate effects have to be produced by the dummy gate electrodes 3d in the carrier storage layer 8 in order to suppress a reduction in withstand voltage even if the depth D1 of the bottoms of the gate electrodes 3 becomes shallower than the depth D3 of the bottom of the carrier storage layer 8. Thus, the depth D2 of the bottoms of the dummy gate electrodes 3d has to be deeper than the depth D3 of the bottom of the carrier storage layer 8. That is, a relationship D3<D2 has to be satisfied.

In these three respects, the IGBT 100 according to the first preferred embodiment has to satisfy the relationship D4<D1<D3<D2.

Figure 19:
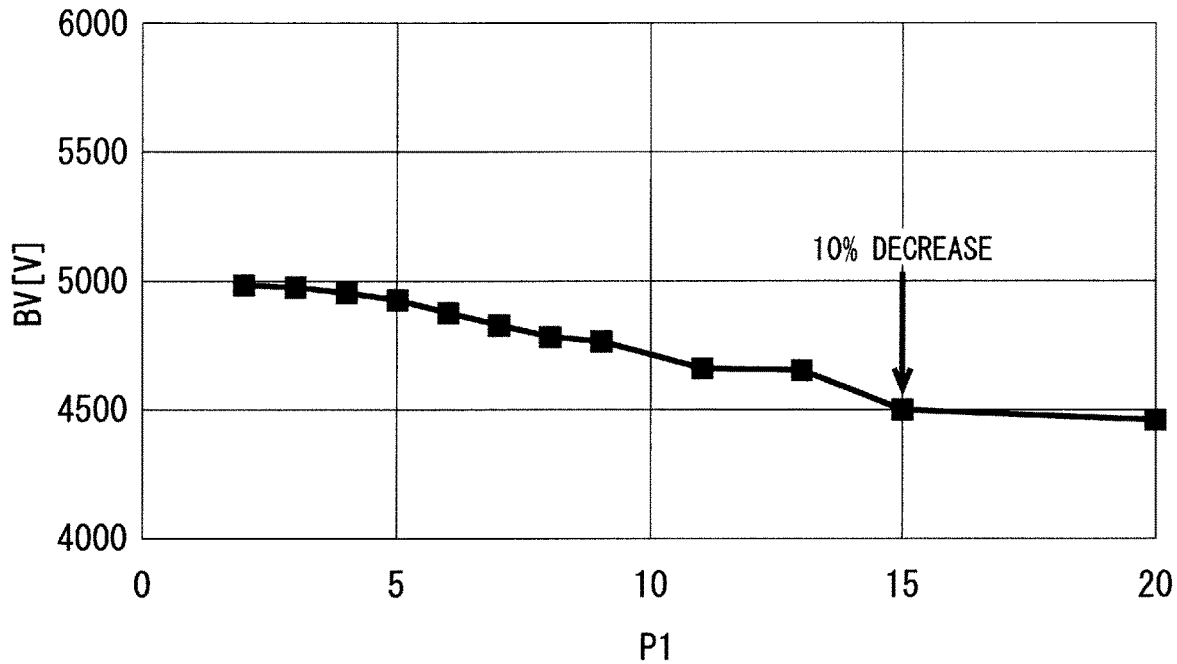
FIG. 19 is a graph showing the dependence of a withstand voltage of the IGBT according to the first preferred embodiment on the interval between two adjacent dummy gate electrodes that sandwich a gate electrode therebetween.

The next description gives the interval (P1 in FIG. 1) between two adjacent dummy gate electrodes 3d that sandwich a gate electrode 3 in the IGBT 100 according to the first preferred embodiment. FIG. 19 is a graph showing the dependence of the withstand voltage of the IGBT 100 on the interval P1. The graph shows that the withstand voltage decreases as the interval P1 increases. In the case where the interval P1 is set to 15 μm, the withstand voltage is approximately 90% of the target withstand voltage (5000V). This is because a too large interval P1 will lessen the field plate effects produced by the gate electrodes 3 and the adjacent dummy gate electrodes 3d and cause an electric field concentration to occur in the vicinity of the bottoms of the gate trenches 2. Note that FIG. 19 shows numerical values for the case where there is no carrier storage layer 8 (i.e., the dose of impurities in the carrier storage layer 8 is zero).

Figure 20:
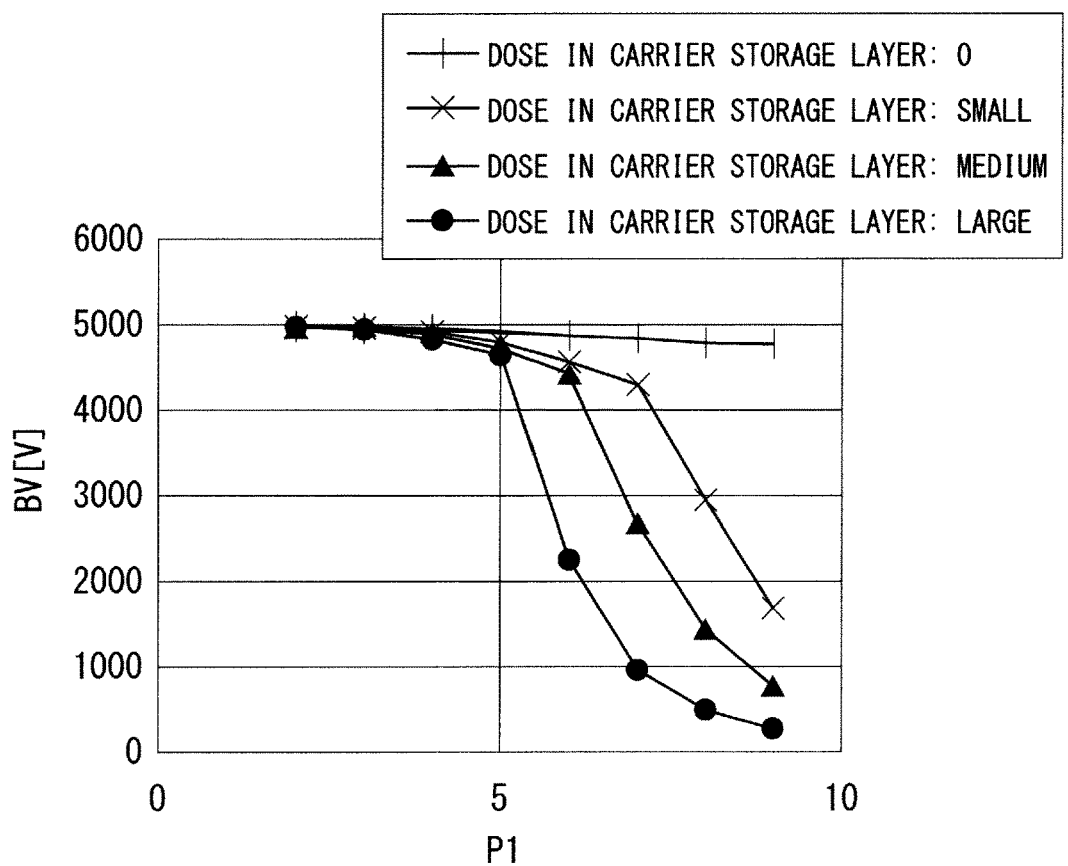
FIG. 20 is a graph showing the relationship between the dose of impurities in the carrier storage layer and the withstand voltage of the IGBT.

FIG. 20 illustrates the relationship between the dose of impurities in the carrier storage layer 8 and the withstand voltage of the IGBT 100. The graph in FIG. 20 shows the dependence of the withstand voltage of the IGBT 100 on the interval P1 as in FIG. 19. As can be seen, the dependence of the withstand voltage on the interval P1 increases as the dose of impurities in the carrier storage layer 8 increases. The graphs in FIGS. 19 and 20 indicate that, in the case of reducing the ON-state voltage by providing the IGBT 100 with the carrier storage layer 8, the interval P1 has to be set to less than or equal to 15 μm in order to ensure 90% or more of the target withstand voltage.

As described above, the IGBT 100 according to the first preferred embodiment can reduce switching loss while effecting a reduction in ON-state voltage with the presence of the carrier storage layer 8 and maintaining voltage endurance induced by the field plate effects of the dummy gate electrodes 3d.

Figure 21:
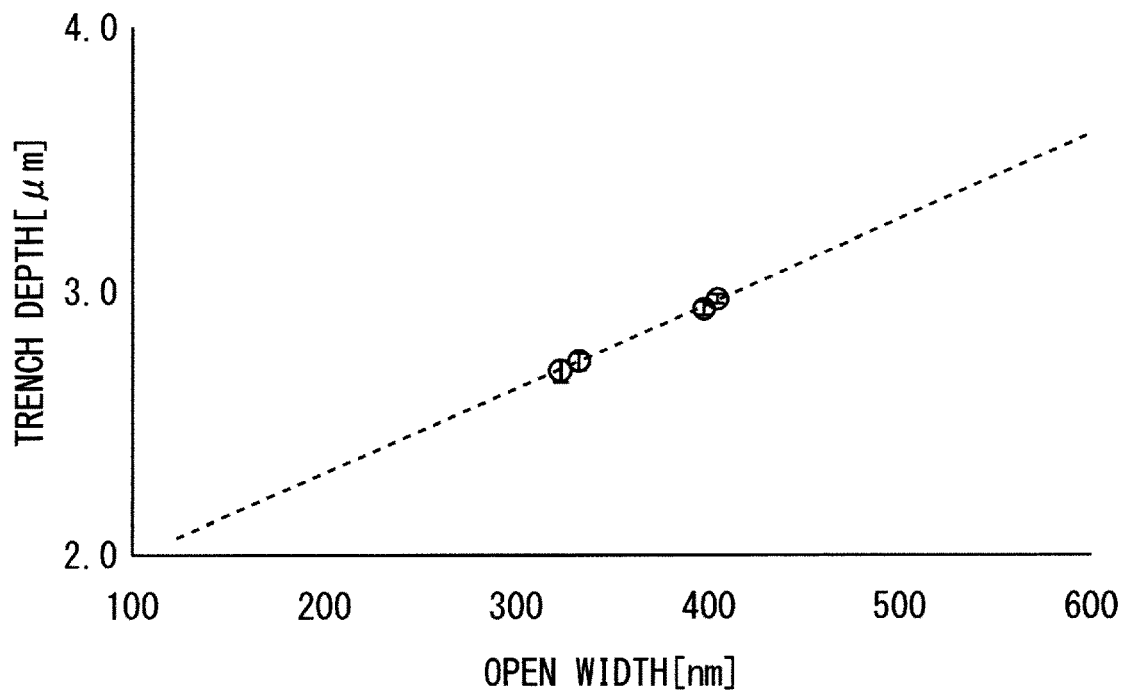
FIG. 21 is a graph showing the relationship between the open width of an etching mask and the depth of trenches to be formed.

FIG. 21 is a graph showing the relationship between the open width of an etching mask and the depth of trenches to be formed in the step of forming trenches by etching. As illustrated in FIG. 21, the depth of the trenches and the open width of the etching mask correlate to each other, i.e., the depth of the trenches to be formed decreases as the open width of the etching mask decreases. The gradient and absolute values of the correlation (graph in FIG. 21) between the open width of the etching mask and the depth of the trenches can be adjusted by adjusting conditions for plasm dry etching.

In order to manufacture the IGBT 100, the gate trenches 2 and the dummy gate trenches 2d have to be formed to different depths in the semiconductor substrate 1. The gate trenches 2 and the dummy gate trenches 2d can be formed simultaneously by using the correlation between the open width of the etching mask and the trench depth. A method of manufacturing the IGBT 100 according to the first preferred embodiment will be described hereinafter with reference to configuration diagrams in FIGS. 22 to 28.

Figure 22:
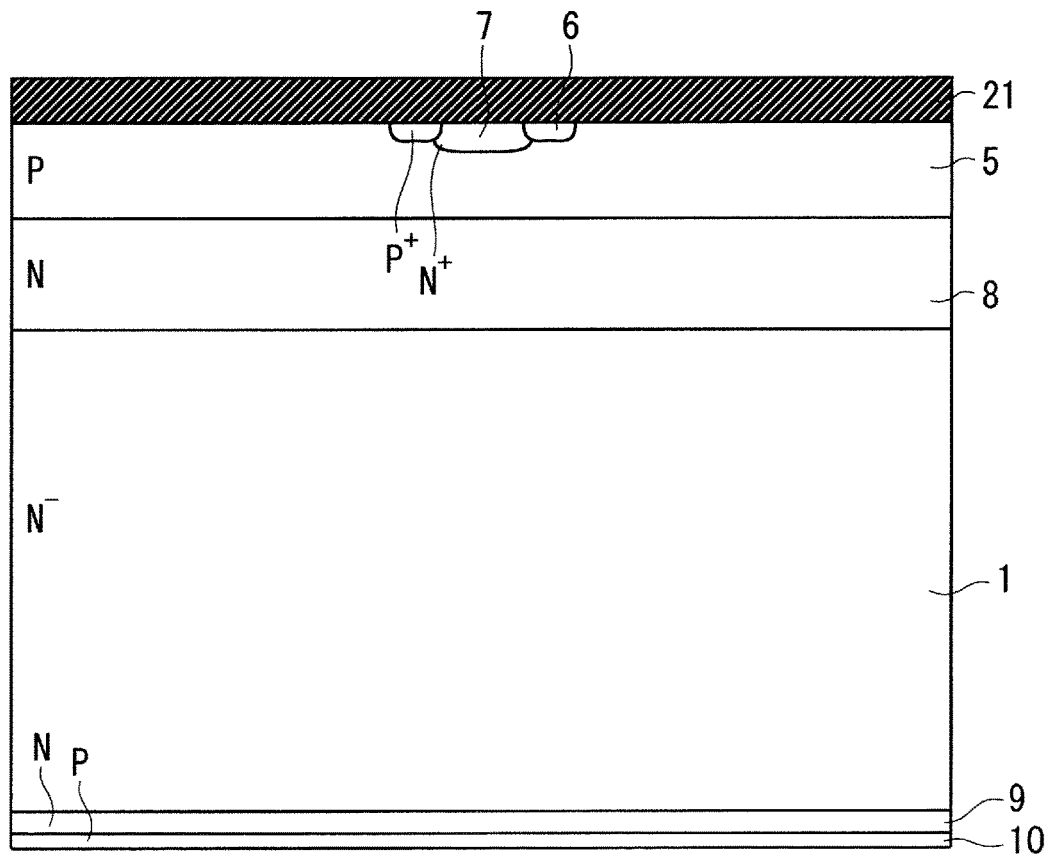
FIG. 22 is a step diagram illustrating a method of manufacturing an IGBT according to the first preferred embodiment.

First, impurity ions are implanted in the semiconductor substrate 1 to form the channel layer 5, the contact layer 6, the emitter layer 7, the carrier storage layer 8, the buffer region 9, and the collector layer 10 in the semiconductor substrate 1. Thereafter, a silicon oxide film 21 that serves as the material for an etching mask is formed on the upper surface of the semiconductor substrate 1 (FIG. 22).

Figure 23:
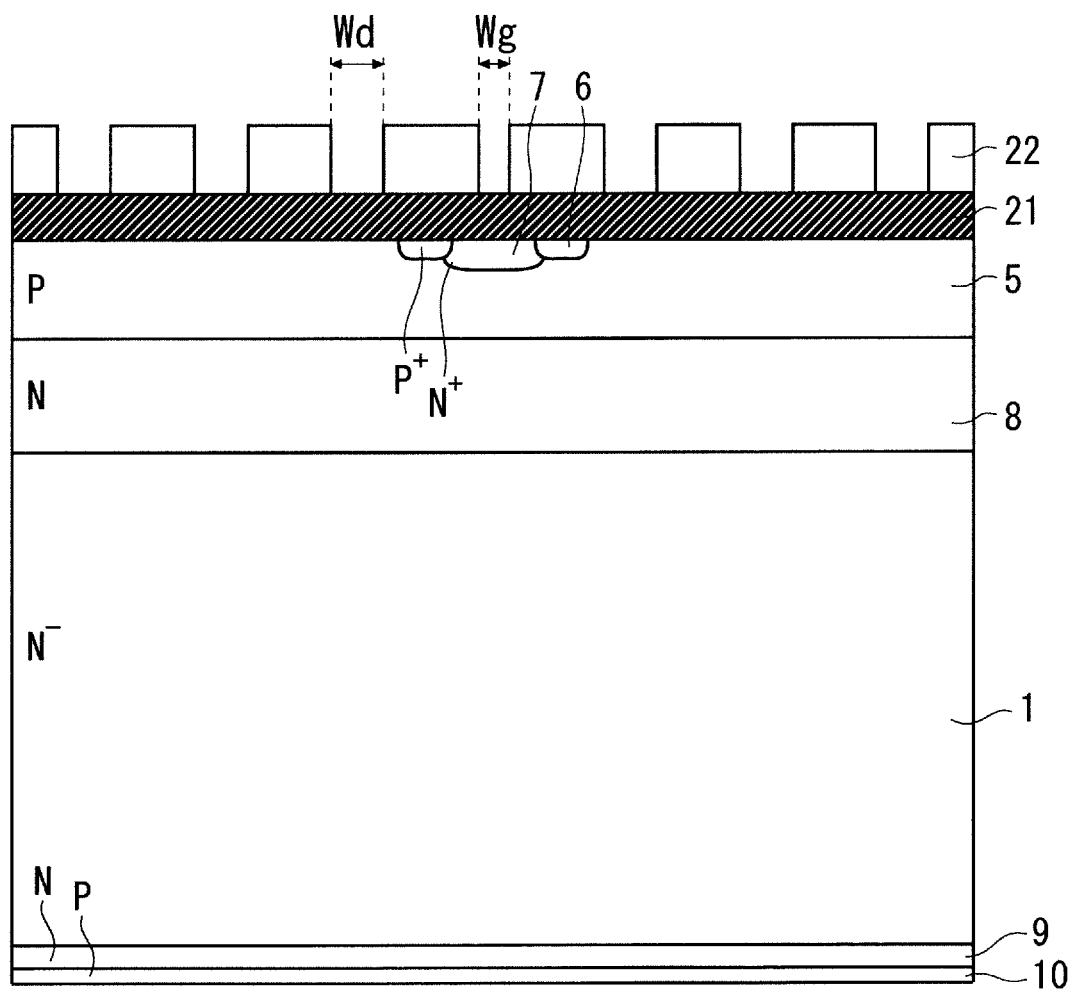
FIG. 23 is a step diagram illustrating the method of manufacturing an IGBT according to the first preferred embodiment.

Next, a photoresist 22 having openings in regions where the gate trenches 2 and the dummy gate trenches 2d are to be formed is formed on the silicon oxide film 21 by photolithography (FIG. 23). At this time, a width Wg of openings that correspond to the regions where the gate trenches 2 are to be formed are made smaller than a width Wd of openings that correspond to the regions where the dummy gate trenches 2d are to be formed.

Figure 24:
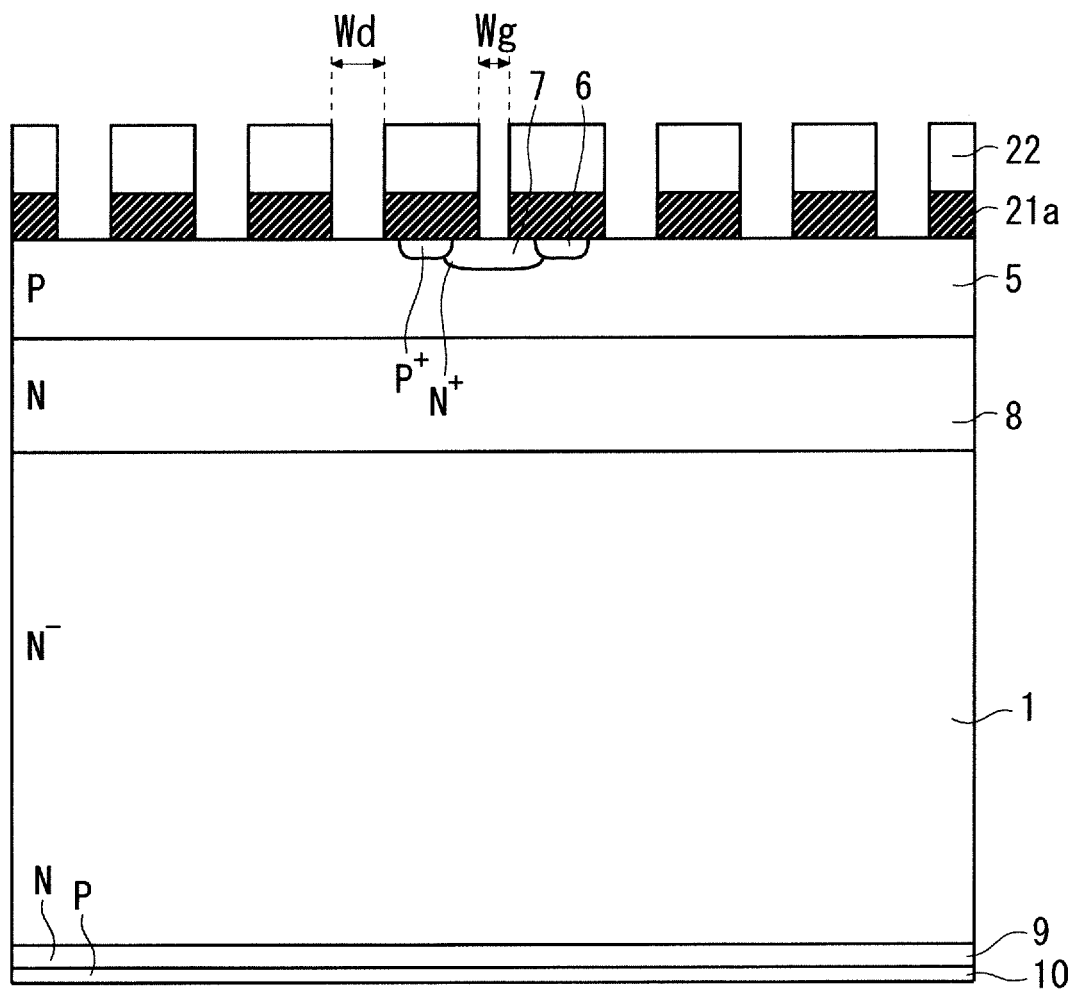
FIG. 24 is a step diagram illustrating the method of manufacturing an IGBT according to the first preferred embodiment.

Then, the pattern of the photoresist 22 is transferred to the silicon oxide film 21 by etching using the photoresist 22 as a mask. As a result, the silicon oxide film 21 is processed into an etching mask 21a that has openings in the regions where the gate trenches 2 and the dummy gate trenches 2d are to be formed (FIG. 24).

Figure 25:
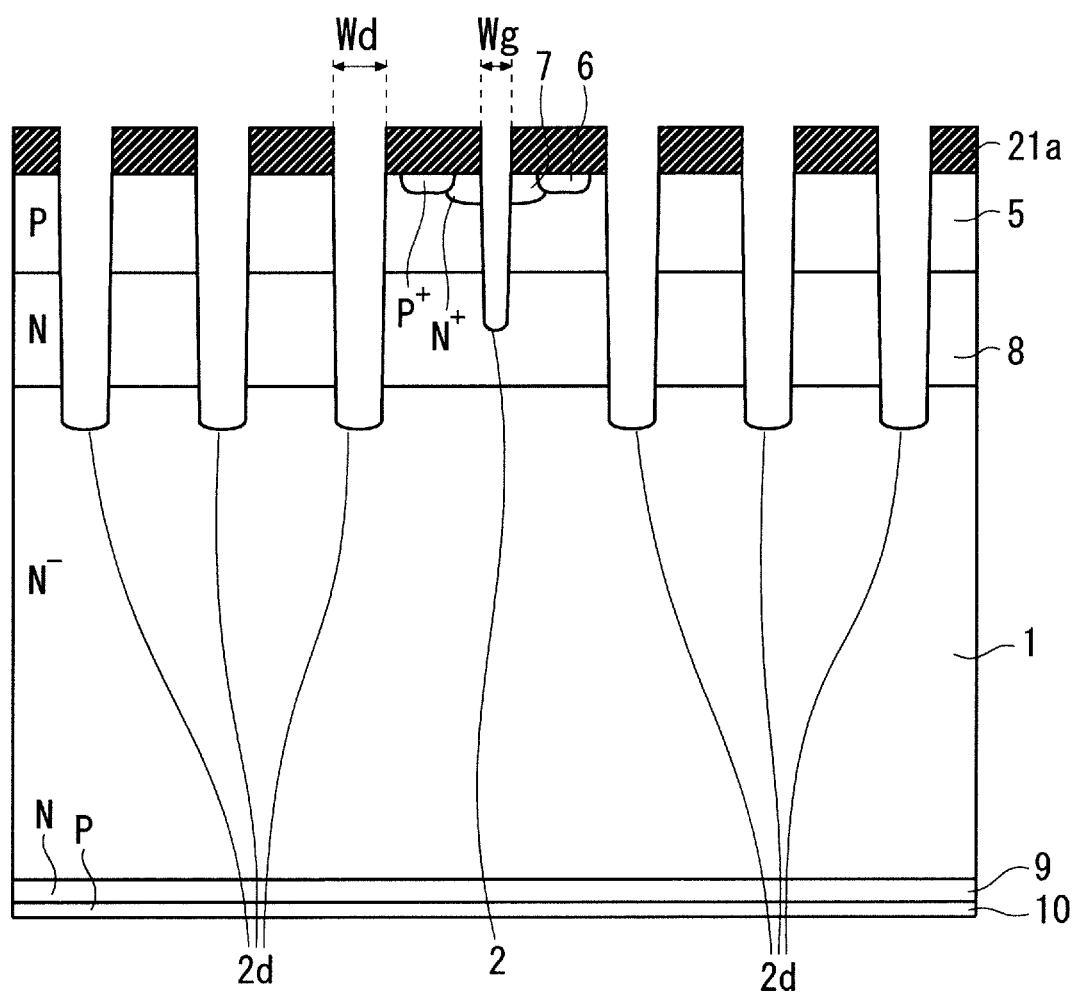
FIG. 25 is a step diagram illustrating the method of manufacturing an IGBT according to the first preferred embodiment.

The semiconductor substrate 1 is thereafter etched using the etching mask 21a as a mask, so that the gate trenches 2 and the dummy gate trenches 2d are formed simultaneously in the semiconductor substrate 1 (FIG. 25). At this time, the gate trenches 2 are formed shallower than the dummy gate trenches 2d because the width Wg of the openings corresponding to the regions where the gate trenches 2 are to be formed is smaller than the width Wd of the openings corresponding to the regions where the dummy gate trenches 2d are to be formed.

Figure 26:
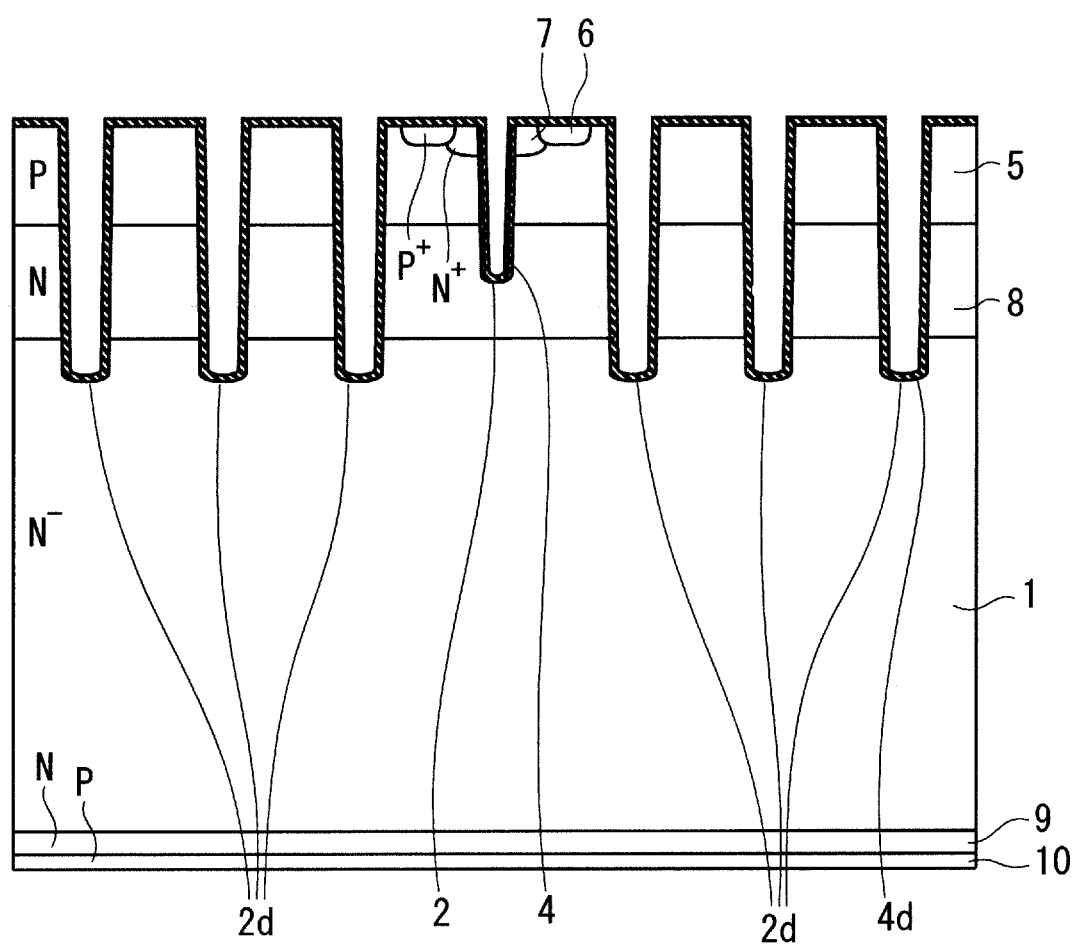
FIG. 26 is a step diagram illustrating the method of manufacturing an IGBT according to the first preferred embodiment.
Figure 27:
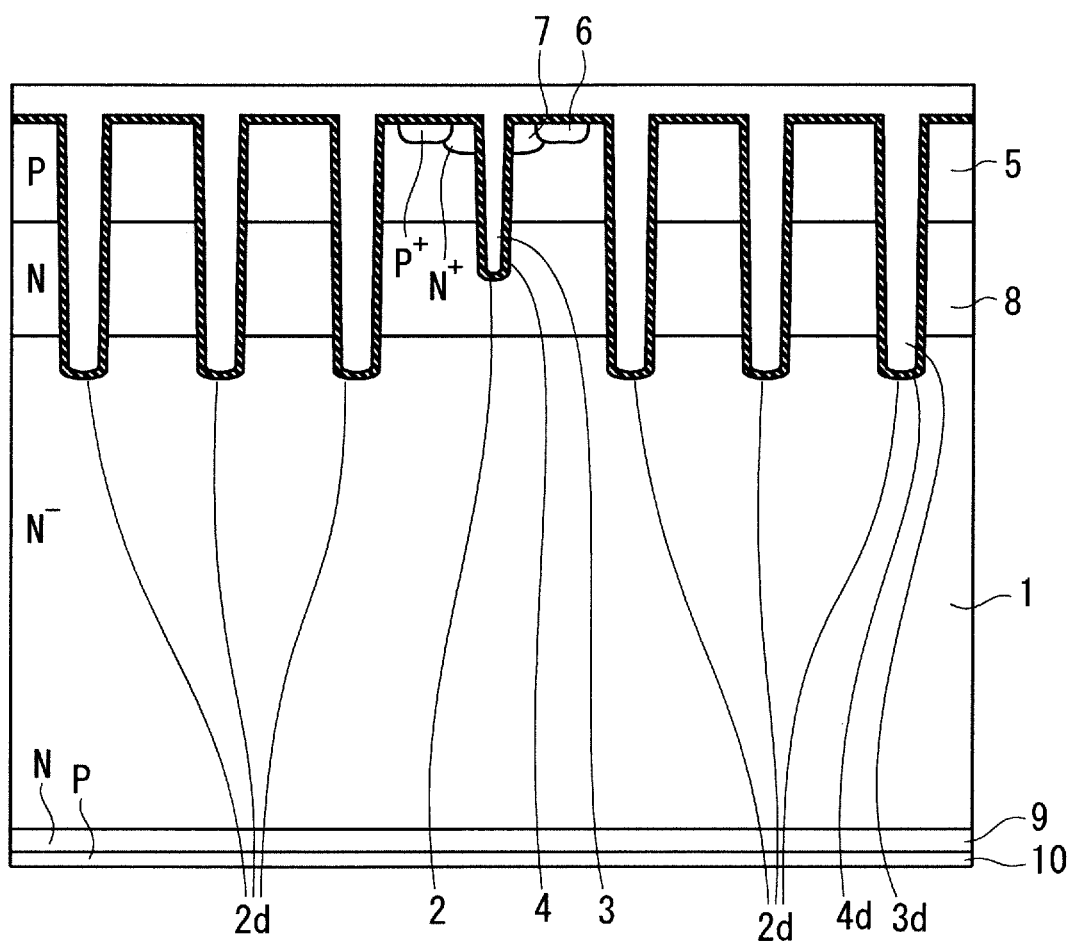
FIG. 27 is a step diagram illustrating the method of manufacturing an IGBT according to the first preferred embodiment.

Then, for example, a silicon oxide film is formed on the upper surface of the semiconductor substrate 1, including the inner surfaces of the gate trenches 2 and the dummy gate trenches 2d, so as to form the gate insulating film 4 on the side walls and bottoms of the gate trenches 2 and form the dummy gate insulating film 4d on the side walls and bottoms of the dummy gate trenches 2d (FIG. 26). Moreover, for example, a doped polysilicon film is formed on the upper surface of the semiconductor substrate 1, including the inner surfaces of the gate trenches 2 and the dummy gate trenches 2d, so as to form the gate electrodes 3 in the gate trenches 2 and form the dummy gate electrodes 3d in the dummy gate trenches 2d (FIG. 27).

Figure 28:
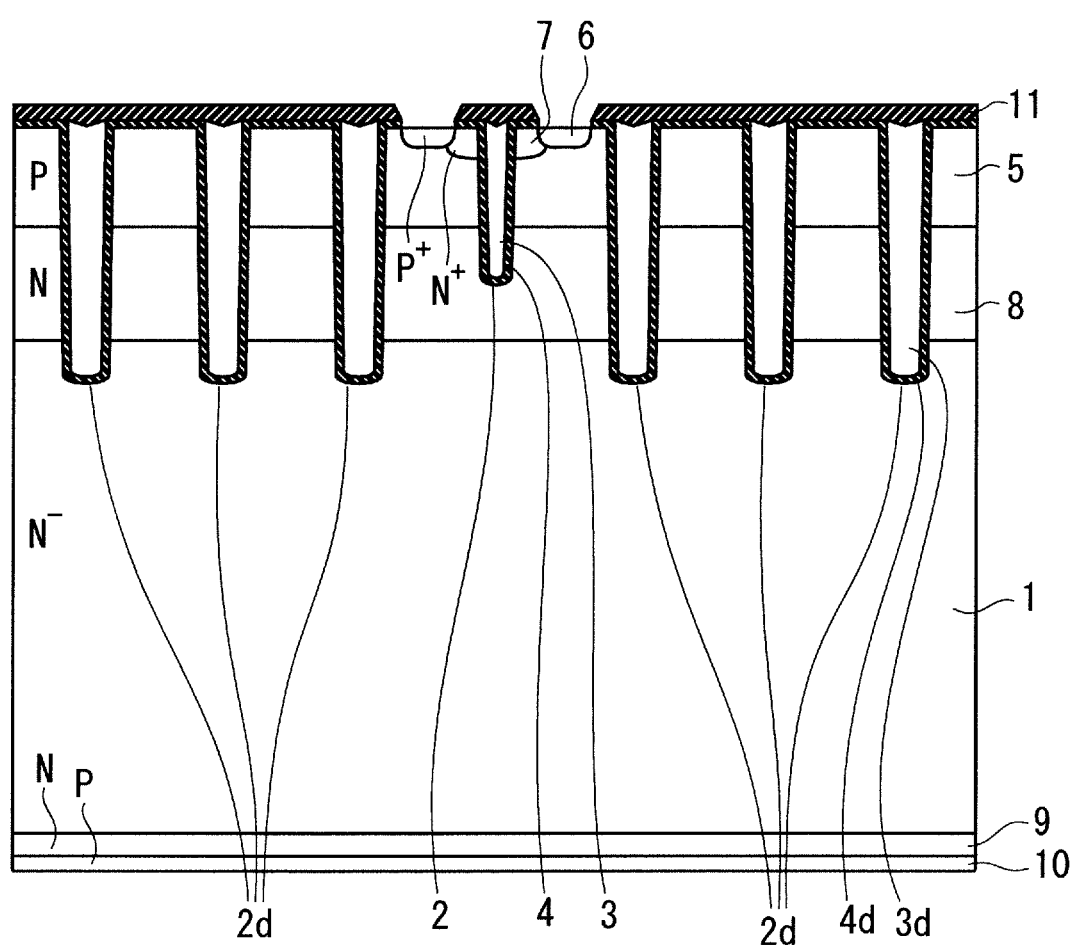
FIG. 28 is a step diagram illustrating the method of manufacturing an IGBT according to the first preferred embodiment.

The gate electrodes 3 and the dummy gate electrodes 3d are thereafter isolated from one another by patterning the doped polysilicon film. Then, for example, a silicon oxide film is formed on the semiconductor substrate 1 to form the interlayer insulation film 11. The interlayer insulation film 11 is then selectively etched to form contact holes that reach the contact layer 6 in the interlayer insulation film 11 (FIG. 28).

Then, the emitter electrode 12 is formed on the upper surface side of the semiconductor substrate 1, and the collector electrode 13 is formed on the lower surface side of the semiconductor substrate 1. A resultant configuration is the IGBT 100 illustrated in FIG. 1.

First Variation

Figure 29:
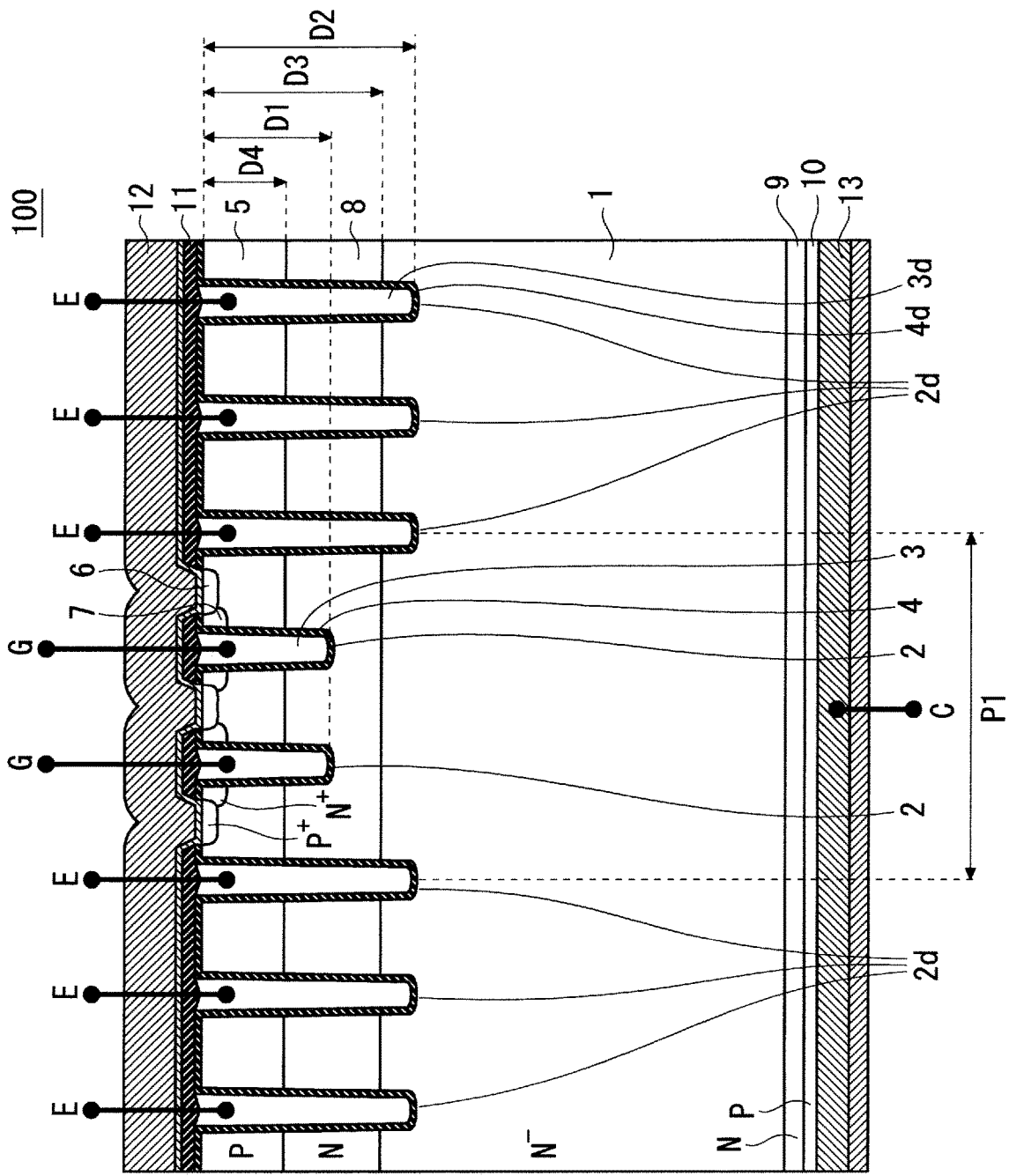
FIG. 29 illustrates a first variation of the IGBT according to the first preferred embodiment.

FIG. 29 illustrates a first variation of the IGBT 100 according to the first preferred embodiment. In the IGBT 100 in FIG. 29, a plurality of (here, two) gate electrodes 3 is disposed between two adjacent dummy gate electrodes 3d. The relationship of the depth D1 of the bottoms of the gate electrodes 3, the depth D2 of the bottoms of the dummy gate electrodes 3d, the depth D3 of the bottom of the carrier storage layer 8, and the depth D4 of the bottom of the channel layer 5, and the conditions for the interval P1 between two adjacent dummy gate electrodes 3d that sandwich gate electrodes 3 may be the same as those in the case where one gate electrode 3 is disposed between two adjacent dummy gate electrodes 3d. Even in the case where a plurality of gate electrodes 3 is disposed between two adjacent dummy gate electrodes 3d, approximately equivalent effects to those of the first preferred embodiment can be achieved.

Second Variation

Figure 30:
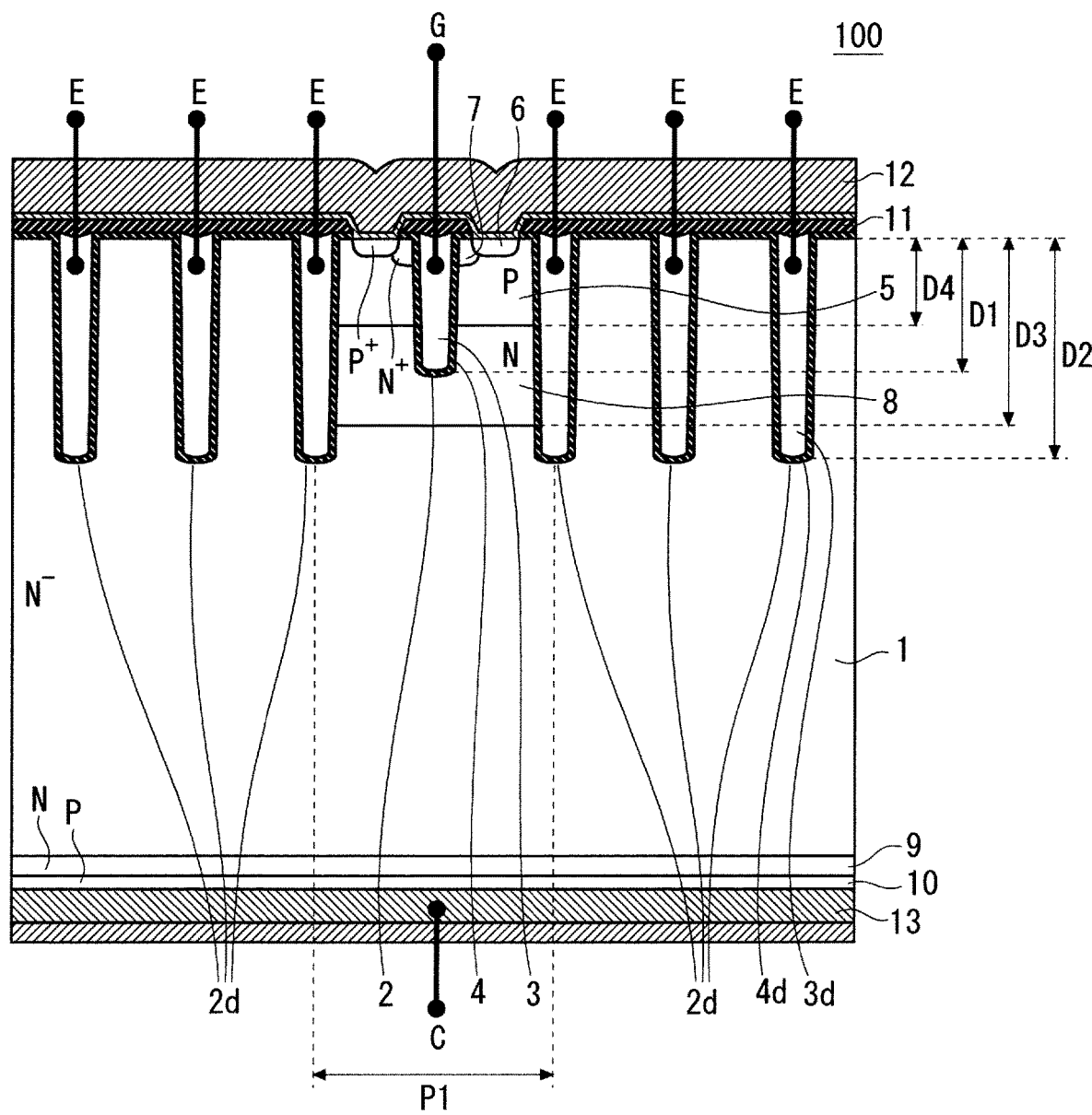
FIG. 30 illustrates a second variation of the IGBT according to the first preferred embodiment.

FIG. 30 illustrates a second variation of the IGBT 100 according to the first preferred embodiment. In the IGBT 100 in FIG. 30, the channel layer 5 and the carrier storage layer 8 are formed in only the region around the gate electrode 3, i.e., the region where the gate electrode 3 exists between two adjacent dummy gate electrodes 3d. In other words, the channel layer 5 and the carrier storage layer 8 are not formed in the regions where the dummy gate electrodes 3d are adjacent to each other, i.e., regions where the gate electrodes 3 do not exist between two adjacent dummy gate electrodes 3d. Even in this case, approximately equivalent effects to those of the IGBT 100 according to the first preferred embodiment can be achieved.

Second Preferred Embodiment

Figure 31:
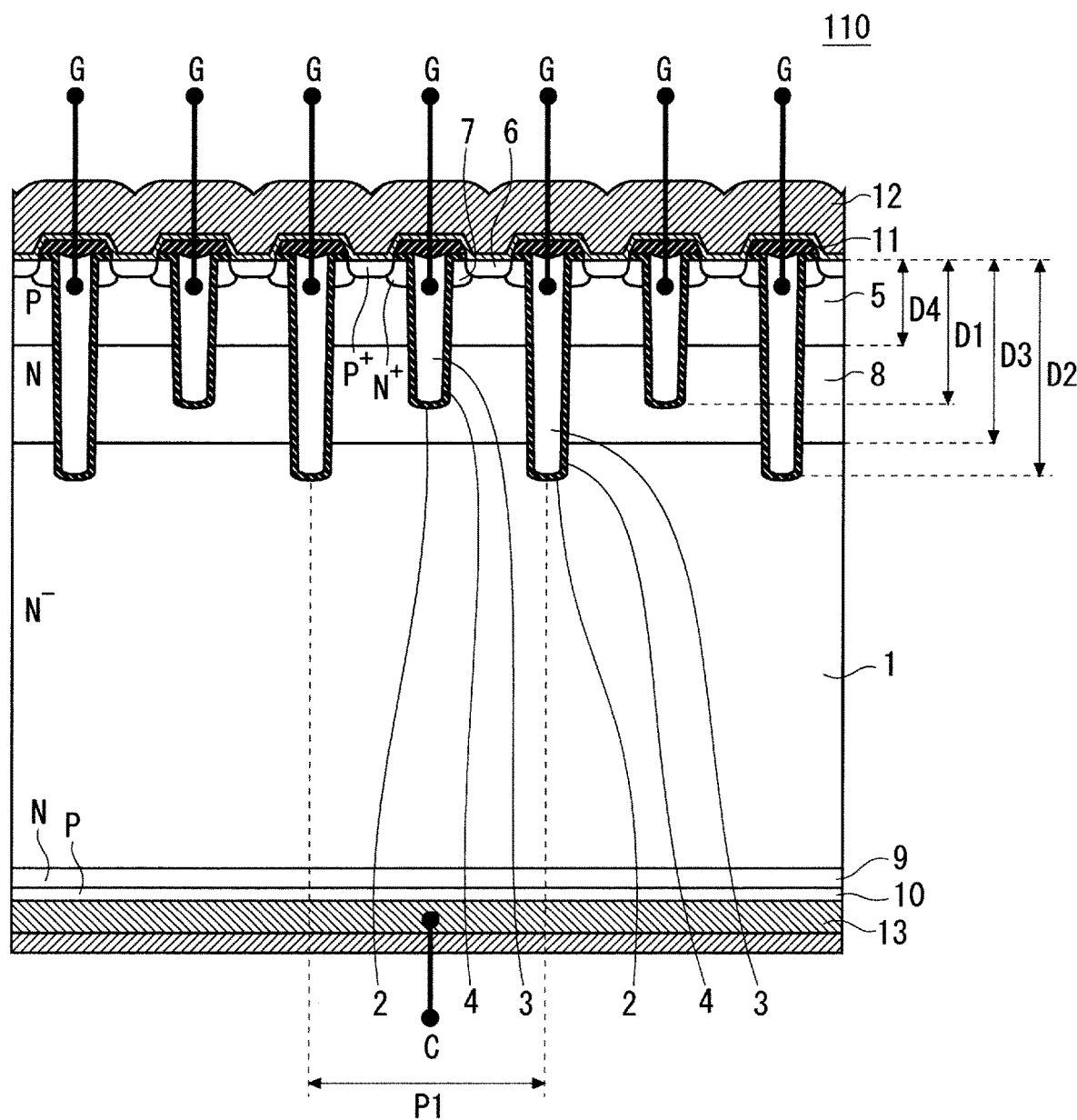
FIG. 31 illustrates a structure of a semiconductor device according to a second preferred embodiment.

FIG. 31 illustrates a structure of a trench gate-type IGBT 110 that is a semiconductor device according to a second preferred embodiment. In FIG. 31, constituent elements having similar functions to those illustrated in FIG. 1 are given the same reference numerals.

The IGBT 110 according to the second preferred embodiment is formed using a semiconductor substrate 1 made of $N^-$-type silicon. On the upper surface side of the semiconductor substrate 1, gate trenches 2 are formed. Each gate trench 2 has embedded therein a gate electrode 3 made of, for example, polysilicon. Between the gate electrodes 3 and the semiconductor substrate 1, a gate insulating film 4 made of, for example, silicon oxide is interposed.

The semiconductor substrate 1 has a P-type channel layer 5 formed in the surface portion on the upper surface side. In the surface portion of the channel layer 5, a $P^+$-type contact layer 6 and an $N^+$-type emitter layer 7 are formed, the contact layer 6 having a higher peak impurity concentration than the channel layer 5, and the emitter layer 7 having a higher peak impurity concentration than the semiconductor substrate 1. The emitter layer 7 is disposed adjacent to the gate trenches 2. Under the channel layer 5, an N-type carrier storage layer 8 is formed.

The semiconductor substrate 1 has a P-type collector layer 10 formed in the surface portion on the lower surface side. Also, an N-type buffer region 9 having a higher peak impurity concentration than the semiconductor substrate 1 is formed on the upper side of the collector layer 10, i.e., between the collector layer 10 and an $N^-$-type region of the semiconductor substrate 1.

On the upper surface of the semiconductor substrate 1, an interlayer insulation film 11 is formed so as to cover the gate electrodes 3. Moreover, an emitter electrode 12 is formed on the interlayer insulation film 11. The interlayer insulation film 11 has contact holes that reach the contact layer 6. The emitter electrode 12 is connected through these contact holes to the contact layer 6. On the lower surface of the semiconductor substrate 1, a collector electrode 13 is formed.

In the IGBT 110 according to the second preferred embodiment, the gate trenches 2 do not have a fixed depth, and some gate trenches 2 are formed shallower than the other gate trenches 2 as illustrated in FIG. 31. That is, the semiconductor substrate 1 includes the gate trenches 2 formed at a shallow depth and the gate trenches 2 formed at a deep depth.

The gate trenches 2 formed at a shallow depth are hereinafter referred to as "shallow gate trenches 2," and the gate electrodes 3 embedded in these gate trenches 2 as "shallow gate electrodes 3." The gate trenches 2 formed at a deep depth are hereinafter referred to as "deep gate trenches 2," and the gate electrodes 3 embedded in these gate trenches 2 as "deep gate electrodes 3."

As illustrated in FIG. 31, a relationship D4<D1<D3<D2 holds true, where D1 is the depth of the bottoms of the shallow gate electrodes 3 embedded in the shallow gate trenches 2, D2 is the depth of the bottoms of the deep gate electrodes 3 embedded in the deep gate trenches 2, D3 is the depth of the bottom of the carrier storage layer 8, and D4 is the depth of the bottom of the channel layer 5.

The interval between two adjacent deep gate electrodes 3 that sandwich a shallow gate electrode 3 is preferably less than or equal to 15 μm. That is, a relationship P1≤15 μM preferably holds true, where P1 is the interval between two adjacent deep gate electrodes 3 that sandwich a shallow gate electrode 3.

The IGBT 110 according to the second preferred embodiment has a larger number of gate electrodes 3 per unit area than that the IGBT 100 according to the first preferred embodiment. Thus, the IGBT 110 can increase current per unit area and is applicable to applications that require large current.

The IGBT 110 according to the second preferred embodiment includes the shallow gate electrodes 3 and thus has a smaller gate-collector parasitic capacitance Cgc than the conventional IGBT 903 illustrated in FIG. 4. Therefore, the IGBT 110 can achieve similar effects to those of the first preferred embodiment. However, when compared with the IGBT 100 according to the first preferred embodiment, the effects of the IGBT 110 decrease because the gate-collector parasitic capacitance Cgc increases due to a large number of gate electrodes 3.

Variations

Figure 32:
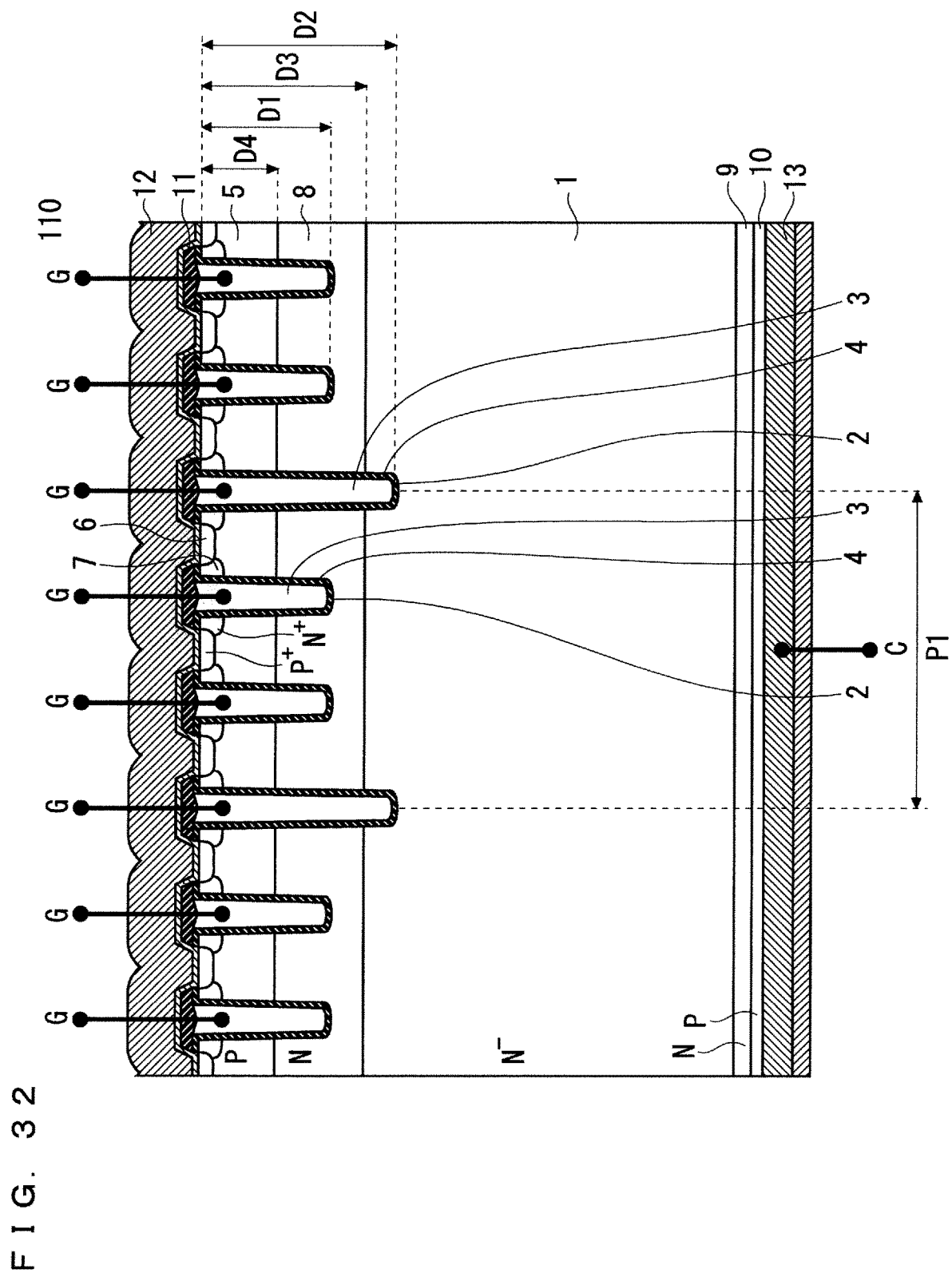
FIG. 32 illustrates a variation of the IGBT according to the second preferred embodiment.

FIG. 32 illustrates an example of a variation of the IGBT 110 according to the second preferred embodiment. In the IGBT 110 illustrated in FIG. 32, a plurality of (here, two) shallow gate electrodes 3 is disposed between two adjacent deep gate electrodes 3. The relationship of the depth D1 of the bottoms of the shallow gate electrodes 3, the depth D2 of the bottoms of the deep gate electrodes 3, the depth D3 of the bottom of the carrier storage layer 8, and the depth D4 of the bottom of the channel layer 5, and the conditions for the interval P1 between two adjacent deep gate electrodes 3 that sandwich shallow gate electrodes 3 may be the same as those in the case where one shallow gate electrode 3 is disposed between two adjacent deep gate electrodes 3. Even in the case where a plurality of gate electrodes 3 is disposed between two adjacent deep gate electrodes 3, approximately equivalent effects to those of the first preferred embodiment can be achieved.

Third Preferred Embodiment

The present preferred embodiment describes a power converter that applies the semiconductor device according to the aforementioned first or second preferred embodiment.

The third preferred embodiment is not limited to a specific power converter. Hereinafter, a case where the semiconductor device according to the first or second preferred embodiment is applied to a three-phase inverter is described as the third preferred embodiment.

Figure 33:
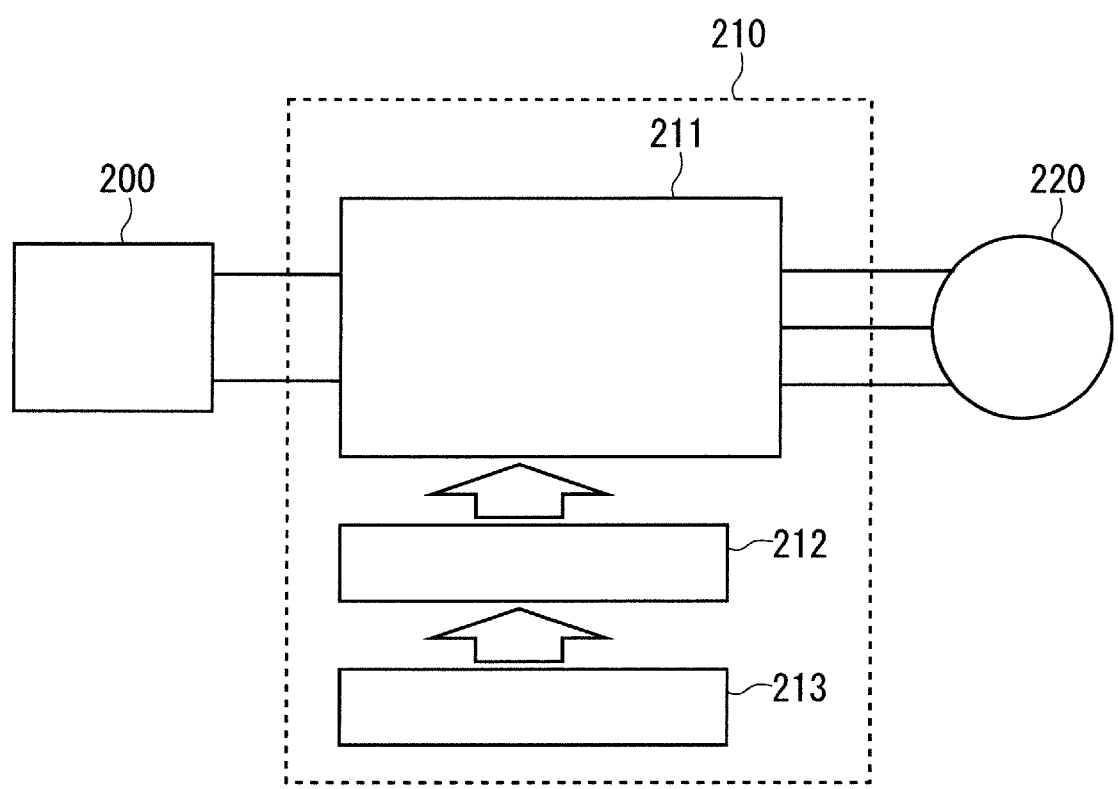
FIG. 33 is a block diagram illustrating a power conversion system applying a power converter according to a third preferred embodiment.

FIG. 33 is a block diagram illustrating a configuration of a power conversion system that applies the power converter according to the present preferred embodiment.

The power conversion system illustrated in FIG. 33 is configured by a power supply 200, a power converter 210, and a load 220. The power supply 200 is a direct-current power supply and supplies direct-current power to the power converter 210. The power supply 200 may be configured by various constituent elements such as a direct-current system, a solar cell, and a storage battery, or may be configured by a rectifier circuit or an AC/DC converter that is connected to an alternating-current system. As another alternative, the power supply 200 may be configured by a DC/DC converter that converts direct-current power output from a direct-current system into predetermined power.

The power converter 210 is a three-phase inverter connected between the power supply 200 and the load 220, and converts direct-current power supplied from the power supply 200 into alternating-current power and supplies the alternating-current power to the load 220. As illustrated in FIG. 33, the power converter 210 includes a main converter circuit 211 that converts direct-current power into alternating-current power and outputs the alternating-current power, a drive circuit 212 that outputs a driving signal for driving each switching element of the main converter circuit 211, and a control circuit 213 that outputs a control signal for controlling the drive circuit 212 to the drive circuit 212.

The load 220 is a three-phase electric motor that is driven by alternating-current power supplied from the power converter 210. Note that the use of the load 220 is not limited to specific applications. The load 220 is an electric motor mounted on various types of electrical apparatuses. For example, the load 220 may be used as an electric motor for hybrid automobiles, electric automobiles, railway vehicles, elevators, or air conditioners.

The details of the power converter 210 will be described hereinafter. The main converter circuit 211 includes switching elements and reflux diodes (not shown). The main converter circuit 211 converts direct-current power supplied from the power supply 200 into alternating-current power and supplies the alternating-current power to the load 220 by switching the switching elements. The main converter circuit 211 may take various types of specific circuit configurations. The main converter circuit 211 according to the present preferred embodiment is a two-level three-phase full-bridge circuit that can be configured by six switching elements and six reflux diodes that are respectively connected in anti-parallel with the six switching elements. The semiconductor device according to the aforementioned first or second preferred embodiment is applied to each switching element of the main converter circuit 211. Each two of the six switching elements are connected in series and constitute upper and lower arms, and each pair of upper and lower arms constitutes each phase (U phase, V phase, or W phase) of the full-bridge circuit. The output terminal for each pair of upper and lower arms, i.e., three output terminals of the main converter circuit 211, are connected to the load 220.

The drive circuit 212 generates driving signals for driving the switching elements of the main converter circuit 211 and supplies the driving signals to the control electrodes of the switching elements of the main converter circuit 211. Specifically, the drive circuit 212 outputs a driving signal for turning a switching element on and a driving signal for turning a switching element off to the control electrode of each switching element, in accordance with the control signal received from the control circuit 213, which will be described later. In the case of maintaining a switching element in the ON state, the driving signal is a voltage signal (ON signal) having a value greater than or equal to the threshold voltage of the switching element. In the case of maintaining a switching element in the OFF state, the driving signal is a voltage signal (OFF signal) having a value less than or equal to the threshold voltage of the switching signal.

The control circuit 213 controls the switching elements of the main converter circuit 211 so that desired power is supplied to the load 220. Specifically, on the basis of power that is to be supplied to the load 220, the control circuit 213 calculates the time (ON time) when each switching element of the main converter circuit 211 is tuned on. For example, the control circuit 213 can control the main converter circuit 211 by PWM control in which the ON time of each switching element is modulated in accordance with the voltage that is to be output. Then, the control circuit 213 outputs a control command (control signal) to the drive circuit 212 so that, at each time, an ON signal is output to a switching element that is to be turned on, and an OFF signal is output to a switching element that is to be turned off. In accordance with this control signal, the drive circuit 212 outputs either an ON signal or an OFF signal as a driving signal to the control electrode of each switching element.

By applying the semiconductor device according to the first or second preferred embodiment as a switching element of the main converter circuit 211, the power converter according to the present preferred embodiment can improve conversion efficiency.

Although the present preferred embodiment describes an example in which the semiconductor device according to the first or second preferred embodiment is applied to a two-level three-phase inverter, the present invention is not limited to this example. The semiconductor device according to the first or second preferred embodiment is also applicable to various types of power converters. Although the present preferred embodiment describes a two-level power converter as an example, the semiconductor device according to the first or second preferred embodiment may be applied to a three-level or multi-level power converter, or to a single-phase inverter if power is supplied to a single-phase load. The semiconductor device according to the first or second preferred embodiment is also applicable to a DC/DC converter or an AC/DC converter if power is supplied to a direct-current load or the like.

The use of the power converter according to the present preferred embodiment is not limited to the case where the aforementioned load is an electric motor. For example, the power converter may be used as power supply devices for electric discharge machines or laser beam machines or for dielectric heating cooking appliances or non-contact power supply systems. The power converter may also be used as power conditioners in systems such as photovoltaic power generating systems or condenser systems.

Although the semiconductor substrate 1 according to the first and second preferred embodiments is made of silicon, a wide bandgap semiconductor such as silicon carbide (SiC), gallium nitride-based materials, or diamond, for example, may be used as the semiconductor substrate 1. The application of the wide bandgap semiconductor achieves high withstand voltage, low loss, and high heat resistance of the IGBT.

Although the first conductivity type is the N type and the second conductivity type is the P type in the first and second preferred embodiments, the first conductivity type may be a P type and the second conductivity type may be an N type.

While the invention has been shown and described in detail, the foregoing description is in all aspects illustrative and not restrictive. It is therefore to be understood that numerous modifications and variations can be devised without departing from the scope of the invention.

What is claimed is:

1. A semiconductor device comprising:
a semiconductor substrate of a first conductivity type;
gate trenches formed on an upper surface side of the semiconductor substrate;
gate electrodes embedded in the gate trenches;
a gate insulating film interposed between the gate electrodes and the semiconductor substrate;
a channel layer of a second conductivity type formed in a surface portion on the upper surface side of the semiconductor substrate;
a contact layer of the second conductivity type formed in a surface portion of the channel layer and having a higher peak impurity concentration than the channel layer;
an emitter layer of the first conductivity type formed adjacent to the gate trenches in the surface portion of the channel layer;
a carrier storage layer of the first conductivity type formed below the channel layer;
a collector layer of the second conductivity type formed on a lower surface side of the semiconductor substrate;
a dummy gate trench formed between each two adjacent ones of the gate trenches on the upper surface side of the semiconductor substrate;
dummy gate electrodes embedded in the dummy gate trenches; and
a dummy gate insulating film interposed between the dummy gate electrodes and the semiconductor substrate, wherein
a relationship D4<D1<D3<D2 holds true,
where D1 is a depth of bottoms of the gate electrodes, D2 is a depth of bottoms of the dummy gate electrodes, D3 is a depth of a bottom of the carrier storage layer, and D4 is a depth of a junction between the channel layer and the carrier storage layer.

2. The semiconductor device according to claim 1, wherein
an interval between two adjacent ones of the dummy gate electrodes that sandwich at least one of the gate electrodes therebetween is less than or equal to 15 μm.

3. The semiconductor device according to claim 1, wherein
the dummy gate electrodes are electrically connected to the contact layer.

4. The semiconductor device according to claim 2, wherein
the dummy gate electrodes are electrically connected to the contact layer.

5. A power converter including the semiconductor device according to claim 1, the power converter comprising:
a main converter circuit to convert input power and output converted power, the main converter circuit including the semiconductor device;
a drive circuit to output a driving signal for driving the semiconductor device to the semiconductor device; and
a control circuit to output a control signal for controlling the drive circuit to the drive circuit.

6. A power converter including the semiconductor device according to claim 2, the power converter comprising:
a main converter circuit to convert input power and output converted power, the main converter circuit including the semiconductor device;
a drive circuit to output a driving signal for driving the semiconductor device to the semiconductor device; and
a control circuit to output a control signal for controlling the drive circuit to the drive circuit.

7. A power converter including the semiconductor device according to claim 3, the power converter comprising:
a main converter circuit to convert input power and output converted power, the main converter circuit including the semiconductor device;
a drive circuit to output a driving signal for driving the semiconductor device to the semiconductor device; and
a control circuit to output a control signal for controlling the drive circuit to the drive circuit.

8. A power converter including the semiconductor device according to claim 4, the power converter comprising:
a main converter circuit to convert input power and output converted power, the main converter circuit including the semiconductor device;
a drive circuit to output a driving signal for driving the semiconductor device to the semiconductor device; and
a control circuit to output a control signal for controlling the drive circuit to the drive circuit.

* * * * *